(12) United States Patent
Motiee et al.

(10) Patent No.: US 7,956,517 B1
(45) Date of Patent: *Jun. 7, 2011

(54) MEMS STRUCTURE HAVING A STRESS INVERTER TEMPERATURE-COMPENSATED RESONATOR MEMBER

(75) Inventors: Mehrnaz Motiee, Fremont, CA (US); Roger T. Howe, Los Gatos, CA (US); Emmanuel P. Quevy, El Cerrito, CA (US); David H. Bernstein, San Francisco, CA (US)

(73) Assignee: Silicon Laboratories, Austin, TX (US)

( * ) Notice: Subject to any disclaimer, the term of this patent is extended or adjusted under 35 U.S.C. 154(b) by 327 days.

This patent is subject to a terminal disclaimer.

(21) Appl. No.: 12/204,713

(22) Filed: Sep. 4, 2008

Related U.S. Application Data

(63) Continuation-in-part of application No. 11/801,774, filed on May 10, 2007, now Pat. No. 7,514,853.

(51) Int. Cl.
*H01L 23/34* (2006.01)

(52) U.S. Cl. ........ 310/346; 310/315; 310/341; 310/367; 310/368; 310/321

(58) Field of Classification Search .................. 310/346, 310/341, 367, 368, 338, 321
See application file for complete search history.

(56) References Cited

U.S. PATENT DOCUMENTS

| | | | |
|---|---|---|---|
| 5,541,469 A | 7/1996 | Kaida | |
| 5,912,528 A | 6/1999 | Kumada | |
| 6,557,419 B1 | 5/2003 | Herb et al. | |
| 6,686,807 B1 | 2/2004 | Giousouf et al. | |
| 6,708,491 B1 | 3/2004 | Weaver et al. | |
| 6,717,336 B2 | 4/2004 | Kawashima | |
| 6,739,190 B2 * | 5/2004 | Hsu et al. ........................ | 73/497 |
| 6,987,432 B2 | 1/2006 | Lutz et al. | |
| 6,996,884 B2 | 2/2006 | Aratake et al. | |
| 7,023,065 B2 | 4/2006 | Ayazi et al. | |
| 7,071,793 B2 | 7/2006 | Lutz et al. | |
| 7,202,761 B2 | 4/2007 | Lutz et al. | |
| 7,211,926 B2 | 5/2007 | Quevy et al. | |
| 7,300,814 B2 | 11/2007 | Cunningham et al. | |
| 7,350,424 B2 | 4/2008 | Hjelt et al. | |
| 7,495,199 B2 | 2/2009 | Jankowiak | |
| 7,514,853 B1 * | 4/2009 | Howe et al. .................... | 310/346 |
| 7,591,201 B1 | 9/2009 | Bernstein et al. | |
| 7,639,104 B1 | 12/2009 | Quevy et al. | |
| 2002/0069701 A1 * | 6/2002 | Hsu et al. ........................ | 73/497 |
| 2002/0154380 A1 | 10/2002 | Gelbart | |
| 2003/0006679 A1 | 1/2003 | Kawashima | |
| 2004/0207492 A1 * | 10/2004 | Nguyen et al. ................. | 333/199 |

(Continued)

OTHER PUBLICATIONS

Office Action from U.S. Appl. No. 11/716,285 mailed Feb. 27, 2009, 16 pgs.

(Continued)

*Primary Examiner* — Thomas M Dougherty
*Assistant Examiner* — Bryan P Gordon
(74) *Attorney, Agent, or Firm* — O'Keefe, Egan, Peterman & Enders LLP

(57) ABSTRACT

A MEMS structure having a temperature-compensated resonator member is described. The MEMS structure comprises an asymmetric stress inverter member coupled with a substrate. A resonator member is housed in the asymmetric stress inverter member and is suspended above the substrate. The asymmetric stress inverter member is used to alter the thermal coefficient of frequency of the resonator member by inducing a stress on the resonator member in response to a change in temperature.

24 Claims, 14 Drawing Sheets

U.S. PATENT DOCUMENTS

| | | | |
|---|---|---|---|
| 2005/0046504 | A1 | 3/2005 | Xiaoyu et al. |
| 2005/0250236 | A1 | 11/2005 | Takeuchi et al. |
| 2006/0032306 | A1* | 2/2006 | Robert .................. 73/504.02 |
| 2006/0033594 | A1 | 2/2006 | Lutz et al. |
| 2006/0186971 | A1 | 8/2006 | Lutz et al. |
| 2007/0296526 | A1* | 12/2007 | Lutz et al. .................. 333/186 |
| 2008/0105951 | A1 | 5/2008 | Sato et al. |
| 2008/0224241 | A1 | 9/2008 | Inaba et al. |
| 2009/0158566 | A1 | 6/2009 | Hagelin et al. |
| 2009/0160581 | A1 | 6/2009 | Hagelin et al. |
| 2010/0093125 | A1 | 4/2010 | Quevy et al. |

OTHER PUBLICATIONS

Office Action from U.S. Appl. No. 11/801,774 mailed Apr. 30, 2008, 10 pgs.

Guckel, H., et al., "Diagnostic Microstructures for the Measurement of Intrinsic Strain in Thin Films", J. Micromech. Microeng. 2, 1997, United Kingdom, (1997), 86-95.

Jianqiang, Han, et al., "Dependence of the resonance frequency of thermally excited microcantilever resonators on temperature", Elsevier, Sensors and Actuators, A101, (2002), 37-41.

Omura, Yoshiteru, et al., "New Resonant Accelerometer Based on Rigidity Change", International Conference on Solid-State Sensors and Actuators, Jun. 16-19, 1997, 855-858.

Quevy, Emmanuel P., et al., "Redundant MEMS Resonators for Precise Reference Oscillators", IEEE Radio Frequency Integrated Circuits Symposium, Jun. 12-14, 2005, Long Beach, CA, (2005), 113-116.

Shen, F., et al., "Thermal Effects on Coated Resonant Microcantilevers", Elsevier, Sensors and Actuators, A95, (2001), 17-23.

Office Action from U.S. Appl. No. 11/716,115, mailed Oct. 6, 2008, 10 pgs.

Howe et al., "Mems Structure Having a Stress Inverter Temperature-Compensated Resonanting Member", U.S. Appl. No. 11/801,774, Amendment, Jul. 30, 2008, 16 pgs.

Howe et al., "Mems Structure Having A Stress Inverter Temperature-Compensated Resonanting Member", U.S. Appl. No. 11/801,774, Notice of Allowance, Nov. 26, 2008, 7 pgs.

Bernstein et al., "Mems Structure Having A Compensated Resonanting Member", U.S. Appl. No. 11/716,285, Amendment, May 27, 2009, 17 pgs.

Bernstein et al., "Mems Structure Having A Compensated Resonanting Member", U.S. Appl. No. 11/716,285, Notice Of Allowance, Jun. 22, 2009, 4 pgs.

Quevy et al., "Method For Temperature Compensation In MEMS Resonators With Isolated Regions Of Distinct Material", U.S. Appl. No. 11/716,115, Response To Office Action, Jan. 6, 2009, 20 pgs.

Quevy et al., "Method For Temperature Compensation In MEMS Resonators With Isolated Regions Of Distinct Material", U.S. Appl. No. 11/716,115, Notice Of Allowance, Apr. 7, 2009, 6 pgs.

Quevy et al., "Method For Temperature Compensation In MEMS Resonators With Isolated Regions Of Distinct Material", U.S. Appl. No. 11/716,115, Request For Continued Examination Transmittal, Jul. 1, 2009, 1 pg.

Quevy et al., "Method For Temperature Compensation In MEMS Resonators With Isolated Regions Of Distinct Material", U.S. Appl. No. 11/716,115, Notice Of Allowance, Aug. 10, 2009, 7 pgs.

Quevy et al., "Method For Temperature Compensation In MEMS Resonators With Isolated Regions Of Distinct Material", U.S. Appl. No. 12/950,519, filed Nov. 19, 2010, 46 pgs.

Bernstein, "MEMS Structure Having A Stress-Inducer Temperature. Compensated Resonator Member", U.S. Appl. No. 12/201,819, filed Aug. 29, 2008, 63 pgs.

Bernstein, "MEMS Structure Having A Stress-Inducer Temperature Compensated Resonator Member", U.S. Appl. No. 12/201,819, Office Action, Filed Jan. 11, 2011, 9 pgs.

Bernstein, "MEMS Structure Having A Stress-Inducer Temperature Compensated Resonator Member", U.S. Appl. No. 12/201,819, Amendment and Response to Office Action, Filed Feb. 11, 2011, 17 pgs.

Bernstein, "MEMS Structure Having a Stress-Inducer Temperature Compensated Resonator Member", U.S. Appl. No. 12/201,819, Notice of Allowance, Mailed Mar. 17, 2011, 11 pgs.

* cited by examiner

INCREASING TEMPERATURE

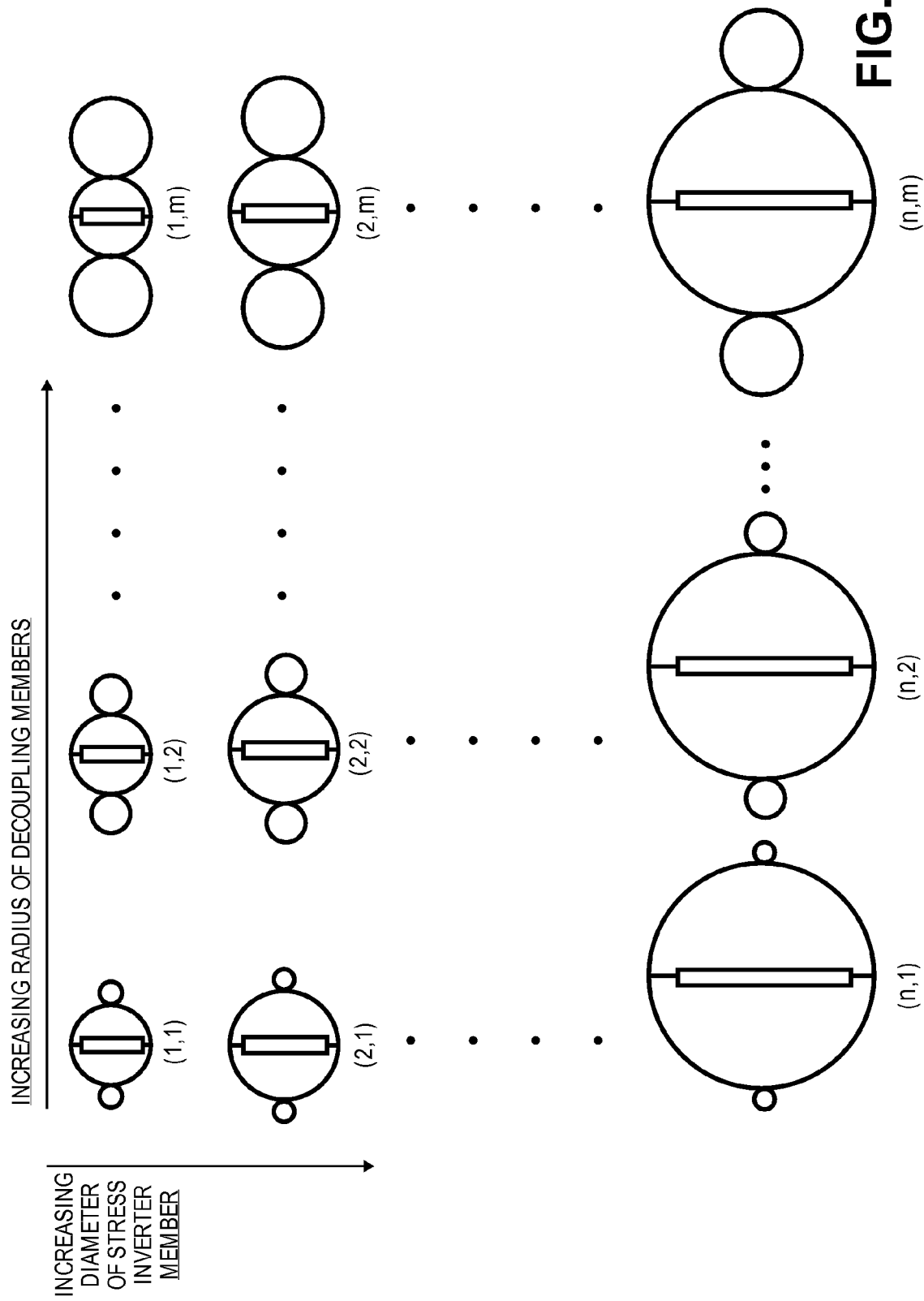

MEMS STRUCTURE HAVING A STRESS INVERTER TEMPERATURE-COMPENSATED RESONATOR MEMBER

CROSS REFERENCE TO RELATED APPLICATIONS

This application is a continuation-in-part of U.S. application Ser. No. 11/801,774, filed May 10, 2007, now U.S. Pat. No. 7,514,853 entitled "MEMS STRUCTURE HAVING A STRESS INVERTER TEMPERATURE-COMPENSATED RESONATING MEMBER," the entire contents of which are hereby incorporated by reference herein.

TECHNICAL FIELD

The invention is in the field of Microelectromechanical Systems (MEMS).

BACKGROUND

For the past several years, MEMS structures have been playing an increasingly important role in consumer products. For example, MEMS devices, such as sensors, detectors and mirrors, can be found in products ranging from air-bag triggers in vehicles to displays in the visual arts industry. As these technologies mature, the demands on precision and functionality of the MEMS structures have escalated. For example, optimal performance may depend on the ability to fine-tune the characteristics of various components of these MEMS structures. Furthermore, consistency requirements for the performance of MEMS devices (both intra-device and device-to-device) often dictate that the processes used to fabricate such MEMS devices need to be extremely sophisticated.

MEMS resonators are also becoming more prevalent. For example, a clocking device for an integrated circuit (IC) may be based on a MEMS resonator. However, if not compensated, the resonance frequency of the resonator member in such a MEMS structure may vary with temperature. Thus, a MEMS resonator may be unable to meet the specifications for frequency stability over the range of ambient temperatures needed for a particular application or may be unreliable for use in devices that generate varying levels of heat during operation. FIGS. 1A-B illustrate isometric views representing a MEMS structure having a non-compensated resonator member responding to an increase in temperature, in accordance with the prior art.

Referring to FIG. 1A, a MEMS structure 100 comprises a resonator member 104 attached to a substrate 102. Substrate 102 is comprised of a material having a first coefficient of thermal expansion (CTE1) and MEMS structure 100 is comprised of a material having a second coefficient of thermal expansion (CTE2), where CTE2 is greater than CTE1. The material of MEMS structure 100 and, hence, resonator member 104 also has a negative thermal coefficient of frequency (TCf). That is, the resonance frequency of resonator member 104 decreases in response to an increase in temperature. As depicted by the arrows in FIG. 1B, the CTE mismatch (CTE2>CTE1) results in a compressive stress induced on resonator member 104 in response to an increase in temperature. That is, substrate 102 effectively constrains the expansion of resonator member 104. This compressive stress may exacerbate the already decreasing frequency tendency of resonator member 104 from the negative TCf.

Temperature-compensated resonator members have been fabricated by using multiple materials with differing physical characteristics. For example, silicon dioxide has been used to control the TCf of poly-SiGe resonators. However, the incorporation of additional materials into a resonator member may impact the high-Q and the high stability normally associated with the single material counterparts.

SUMMARY

Embodiments of the present invention include a MEMS structures having a stress-inverter temperature-compensated resonator member. In an embodiment, a MEMS structure includes an asymmetric stress inverter member coupled to a substrate. A resonator member is housed in the asymmetric stress inverter member and is suspended above the substrate. In one embodiment, the shape of the asymmetric stress inverter member is a shape such as, but not limited to, elliptical or diamond-shaped.

In another embodiment, a MEMS structure includes an asymmetric frame coupled to a substrate by a pair of anchor points. The coefficient of thermal expansion (CTE) of the asymmetric frame is different from the CTE of the substrate. A resonator member is housed in the asymmetric frame and is suspended above the substrate. The resonator member is, in one plane, completely surrounded by the asymmetric frame. A pair of electrodes is coupled with the substrate on either side of the resonator member.

In yet another embodiment, a method for altering the thermal coefficient of frequency of a MEMS structure is provided. The method includes providing a resonator member housed in an asymmetric frame. The asymmetric frame is coupled to a substrate by a pair of anchor points and the resonator member is suspended above the substrate. The CTE of the asymmetric frame is different from the CTE of the substrate and the resonator member is, in one plane, completely surrounded by the asymmetric frame. The method further includes applying a first stress to the asymmetric frame, wherein, in response to applying the first stress, the asymmetric frame applies a second, opposite, stress to the resonator member.

BRIEF DESCRIPTION OF THE DRAWINGS

FIG. 7 illustrates a plan view representing an n by m array of MEMS structures having stress inverter temperature-compensated resonator members, in accordance with an embodiment of the present invention.

DETAILED DESCRIPTION

Figure 1A:
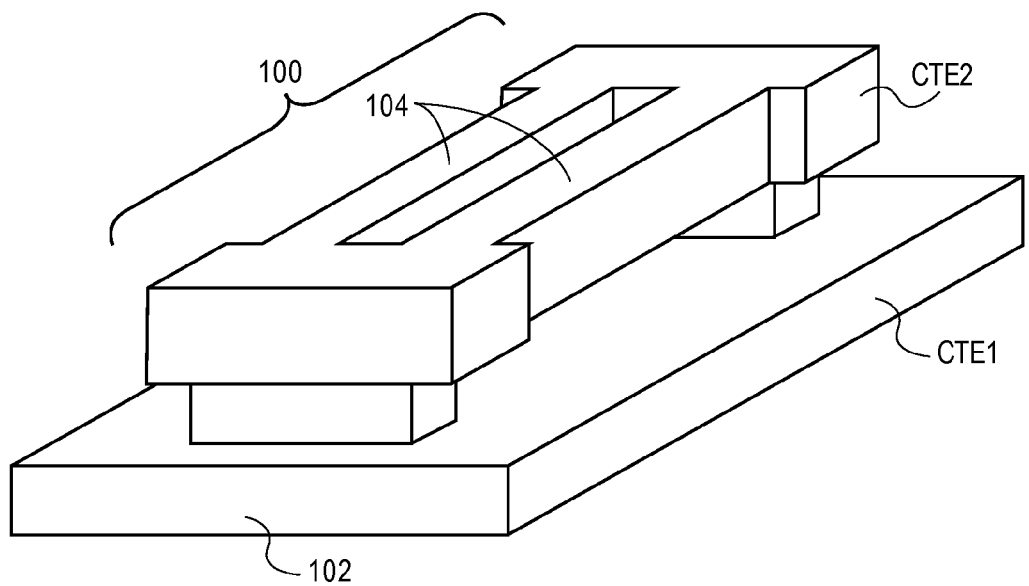
FIGS. 1A-B illustrate isometric views representing a MEMS structure having a non-compensated resonator member responding to an increase in temperature, in accordance with the prior art.
Figure 1B:
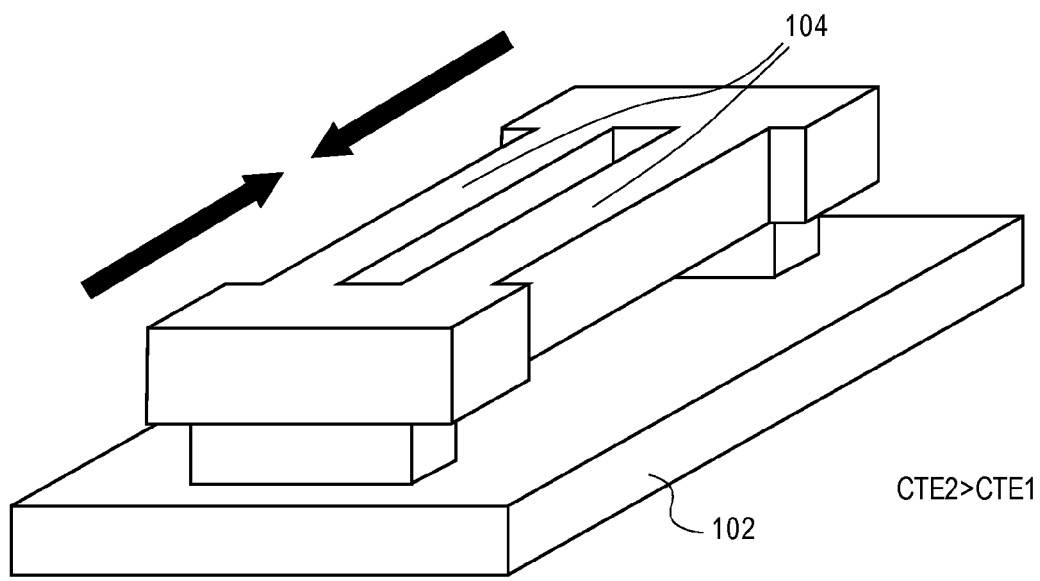

A MEMS structure having a stress inverter temperature-compensated resonator member and a method to form such a structure are described. In the following description, numerous specific details are set forth, such as material compositions and chemical regimes, in order to provide a thorough understanding of the present invention. It will be apparent to one skilled in the art that embodiments of the present invention may be practiced without these specific details. In other instances, well-known features, such as lithographic parameters and patterning procedures, are not described in detail in order to not unnecessarily obscure embodiments of the present invention. Furthermore, it is to be understood that the various embodiments shown in the Figures are illustrative representations and are not necessarily drawn to scale.

Disclosed herein is a MEMS structure having a temperature-compensated resonator member. The MEMS structure may comprise a stress inverter member coupled with a substrate. In an embodiment, a resonator member is housed in the stress inverter member and is suspended above the substrate. In one embodiment, the MEMS stress inverter member is used to alter the thermal coefficient of frequency (TCf) of the resonator member by inverting a first stress and inducing a second, opposite, stress on the resonator member in response to a change in temperature. The stress inverter member may be coupled with the substrate via a pair of decoupling members. In an embodiment, the pair of decoupling members is provided to reduce the magnitude of the stress induced on the resonator member. In one embodiment, an array of n rows and m columns of stress inverter members connected to pairs of decoupling members is provided. In one embodiment, a MEMS structure having a stress inverter member includes an asymmetric frame housing a resonator member.

A MEMS structure having a stress inverter temperature-compensated resonator member may enhance the performance and reliability of a MEMS clocking device that incorporates such a MEMS structure. For example, in accordance with an embodiment of the present invention, a MEMS resonator is comprised of a resonator member having a resonance frequency that changes in correlation with a change in temperature, i.e. it has a non-zero TCf. The non-zero TCf results from a combination of material properties and residual stress from fabrication, but is exacerbated by stress caused from coefficient of thermal expansion (CTE) mismatch between the MEMS structure and a substrate coupled thereto. Thus, in an embodiment, a stress inverter member is used to house the resonator member and to invert the type of stress, caused by CTE mismatch, otherwise experienced by a resonator member. In one embodiment, the inverted stress is used to reduce the magnitude of the TCf of the resonator member. In a specific embodiment, the magnitude of the inverted stress is selected to substantially counter the TCf of the resonator member in order to substantially fix the resonance frequency over a selected temperature range. In a particular embodiment, the resonator member has a negative TCf and the stress inverter member has a CTE greater than the CTE of the substrate. Thus, the stress inverter member experiences a compressive stress in response to an increase in temperature. The stress inverter converts the compressive stress into a tensile stress induced on the resonator member, in order to counter the negative TCf of the resonator member.

Figure 2:
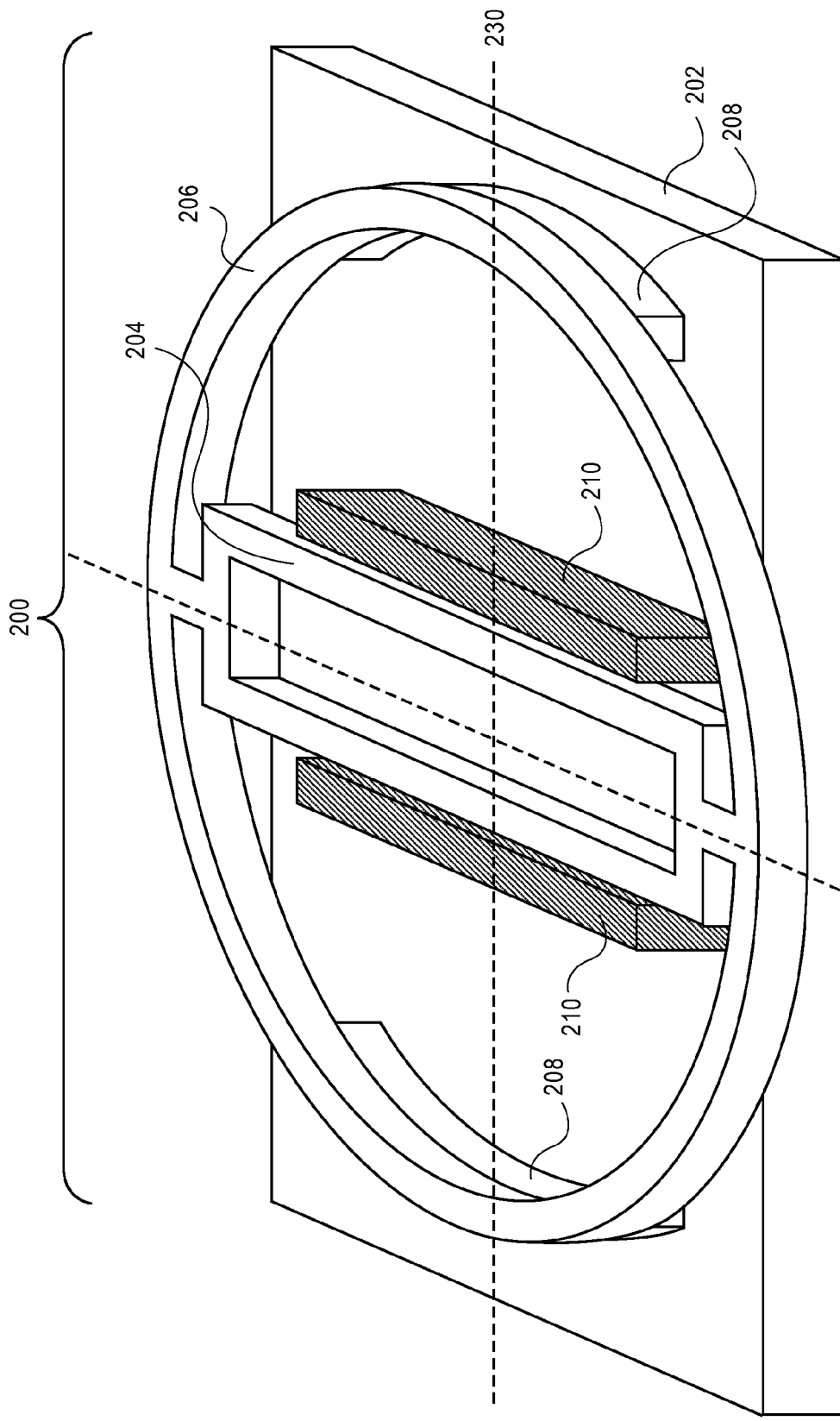
FIG. 2 illustrates an isometric view representing a MEMS structure having a stress inverter temperature-compensated resonator member, in accordance with an embodiment of the present invention.

A MEMS structure may be fabricated having a resonator member housed in a stress inverter member. FIG. 2 illustrates an isometric view representing a MEMS structure having a stress inverter temperature-compensated resonator member, in accordance with an embodiment of the present invention.

Referring to FIG. 2, a MEMS structure 200 is formed on a substrate 202. MEMS structure 200 is comprised of a resonator member 204 suspended above substrate 202 and housed in a stress inverter member 206. Stress inverter member 206 is coupled with substrate 202 via anchors 208. A pair of electrodes 210 is coupled with substrate 202 on either side of resonator member 204.

MEMS structure 200 may be any device that falls within the scope of MEMS technologies. For example, MEMS structure 200 may be any mechanical and electronic structure having a critical dimension of less than approximately 250 microns and fabricated using lithography, deposition, and etching processes above a substrate. In accordance with an embodiment of the present invention, MEMS structure 200 is a device selected from the group consisting of a clock, a sensor, a detector and a mirror. In one embodiment, MEMS structure 200 is a clocking device based on the resonance frequency of resonator member 204.

Thus, resonator member 204 of MEMS structure 200 may be any suspended feature having a mode whose resonance frequency is a function of applied stress. For example, in an embodiment, resonator member 204 is attached to stress inverter member 206 at two opposing points which form axis 220 parallel to the longest dimension of resonator member 204, as depicted in FIG. 2. In a specific embodiment, resonator member 204 is a double-ended tuning fork, i.e. a resonator member comprised of two parallel beams, as is also depicted in FIG. 2. Resonator member 204 may have any dimensions suitable for a desired MEMS function. For example, in accordance with an embodiment of the present invention, MEMS structure 200 is a resonator comprised of a tuning fork resonator member 204. In one embodiment, the length of each beam of resonator member 204 is in the range of 1-250 microns, the thickness of each beam of resonator member 204 is in the range of 0.1-10 microns, the width of each beam of resonator member 204 is in the range of 0.1-100 microns and the relative lateral separation between the two parallel beams is in the range of 0.01-1 times the length of the beams. In a specific embodiment, the length of each beam of resonator member 204 is in the range of 70-90 microns, the thickness of each beam of resonator member 204 is in the range of 0.5-5 microns, the width of each beam of resonator member 204 is in the range of 0.5-5 microns and the distance between the two parallel beams is in the range of 0.5-25 microns. In an embodiment, resonator member 204 is suspended at a distance in the range of 0.1-5 microns above substrate 202.

Stress inverter member 206 may be any structure that can accommodate a stress applied to one region of stress inverter member 206 by altering the shape and positioning of another region of stress inverter member 206. For example, in accordance with an embodiment of the present invention, stress inverter member 206 is anchored to substrate 202 via anchors 208 at two opposing points which form axis 230. In a specific embodiment, axis 230 is orthogonal to axis 220, as depicted in FIG. 2. Thus, a stress applied along axis 230, e.g. a stress from the CTE mismatch with substrate 202, may be accommodated by deforming stress inverter member 206 along axis 220. In one embodiment, stress inverter member 206 is a ring as depicted in FIG. 2. Stress inverter member 206 may have any dimensions suitable to accommodate resonator member 204. In one embodiment, the thickness of stress inverter member 206 is substantially the same as the thickness of resonator member 204, stress inverter member 206 is suspended at substantially the same distance above substrate 202 as resonator member 204 and the width of stress inverter member 206 is in the range of 0.1-25 microns.

Stress inverter member 206 and, hence, resonator member 204 and anchors 208 may be formed from any material suitable for MEMS fabrication. For example, in accordance with an embodiment of the present invention, stress inverter member 206 is comprised of a material selected from the group consisting of a semiconductor, an insulator and a conductor. In one embodiment, stress inverter member 206 is comprised of a semiconductor material selected from the group consisting of silicon, germanium, diamond, silicon-germanium, carbon-doped silicon, carbon-doped silicon-germanium and a III-V material. In a specific embodiment, stress inverter member 206 is comprised of a material selected from the group consisting of amorphous silicon and polycrystalline silicon-germanium. The semiconductor material may also be comprised of dopant impurity atoms. For example, in a specific embodiment, stress inverter member 206 is comprised of polycrystalline silicon-germanium with a germanium atomic concentration in the range of 50-70% and boron dopant impurity atoms with a total atomic concentration in the range of $1 \times 10^{18}$-$5 \times 10^{20}$ atoms/cm$^3$. In one embodiment, stress inverter member 206 is comprised of an insulator material selected from the group consisting of silicon dioxide, silicon nitride, silicon oxy-nitride and a high-k dielectric material. In another embodiment, stress inverter member 206 is comprised of a conductor material selected from the group consisting of copper, aluminum, a metal alloy and a metal silicide. In a particular embodiment, stress inverter member 206, resonator member 204 and anchors 208 are all comprised of substantially the same material.

Stress inverter member 206 and, hence, resonator member 204 and anchors 208 may be formed by any process suitable to provide a MEMS structure having a feature suspended above a substrate. For example, in accordance with an embodiment of the present invention, stress inverter member 206, resonator member 204 and anchors 208 are formed using a combination of structural and release layers by a process selected from the group consisting of a subtractive etch process, a single damascene process, a dual damascene process and a beam-then-anchor process. In one embodiment, stress inverter member 206, resonator member 204 and anchors 208 are formed by using a process wherein all fabrication process steps are carried out at a temperature less than approximately 450° C.

Substrate 202 may be comprised of any material suitable for MEMS fabrication processes and to provide structural integrity for MEMS structure 200. In an embodiment, substrate 202 is comprised of group IV-based materials such as crystalline silicon, germanium or silicon-germanium. In another embodiment, substrate 202 is comprised of a III-V material. Substrate 202 may also comprise an insulator layer. In one embodiment, the insulator layer is comprised of a material selected from the group consisting of silicon dioxide, silicon nitride, silicon oxy-nitride and a high-k dielectric layer. Substrate 202 may itself be an insulator. In one embodiment, substrate 202 substantially comprises a material selected from the group consisting of glass, quartz and sapphire. Substrate 202 may comprise a fabricated integrated circuit formed therein. For example, in accordance with an embodiment of the present invention, substrate 202 comprises an insulator layer above a plurality of interconnect structures which connect a plurality of micro-electronic devices, wherein MEMS structure 200 is fabricated above the insulator layer. In one embodiment, the plurality of micro-electronic devices is a plurality of N-type and P-type transistors and the plurality of interconnect structures is a plurality of metal interconnects that tie the plurality of N-type and P-type transistors into an integrated circuit.

Substrate 202 may have an effective CTE different from the CTE of MEMS structure 200 and, hence, different from stress inverter member 206, resonator member 204 and anchors 208. In one embodiment, the effective CTE of substrate 202 is less than the CTE of MEMS structure 200. The effective CTE is dictated approximately by the CTE of the dominant portion of substrate 202. For example, in an embodiment, substrate 202 comprises an integrated circuit formed on a bulk single-crystal silicon substrate and the effective CTE of substrate 202 is substantially the same as the CTE for mono-crystalline silicon. In a specific embodiment, stress inverter member 206, resonator member 204 and anchors 208 are all comprised of silicon-germanium and have a CTE greater than the CTE of substrate 202.

In the embodiment depicted in FIG. 2, resonator member 204 is driven and sensed electrostatically by the adjacent pair of electrodes 210. However, any means suitable to sustain the resonance motion of resonator member 204 may be used, such as thermal, piezoelectric, piezoresistive or optical means. The pair of electrodes 210 may comprise any material suitable to act as a drive and/or sense electrode for resonator member 204 and suitable for MEMS fabrication. For example, in accordance with an embodiment of the present invention, the pair of electrodes 210 is comprised of a material selected from the group consisting of a semiconductor material heavily doped with charge-carrier impurity atoms, and a conductor. In one embodiment, the pair of electrodes 210 is comprised of a heavily doped semiconductor material and is selected from the group consisting of silicon, germanium, silicon-germanium, carbon-doped silicon, carbon-doped silicon-germanium and a III-V material. In a specific embodiment, the pair of electrodes 210 is comprised of a group IV material and is heavily doped with charge-carrier impurity atoms selected from the group consisting of boron, indium, phosphorus, arsenic and antimony. In an embodiment, the pair of electrodes 210 is comprised of substantially the same material as stress inverter member 206, resonator member 204 and anchors 208.

Figure 3A:
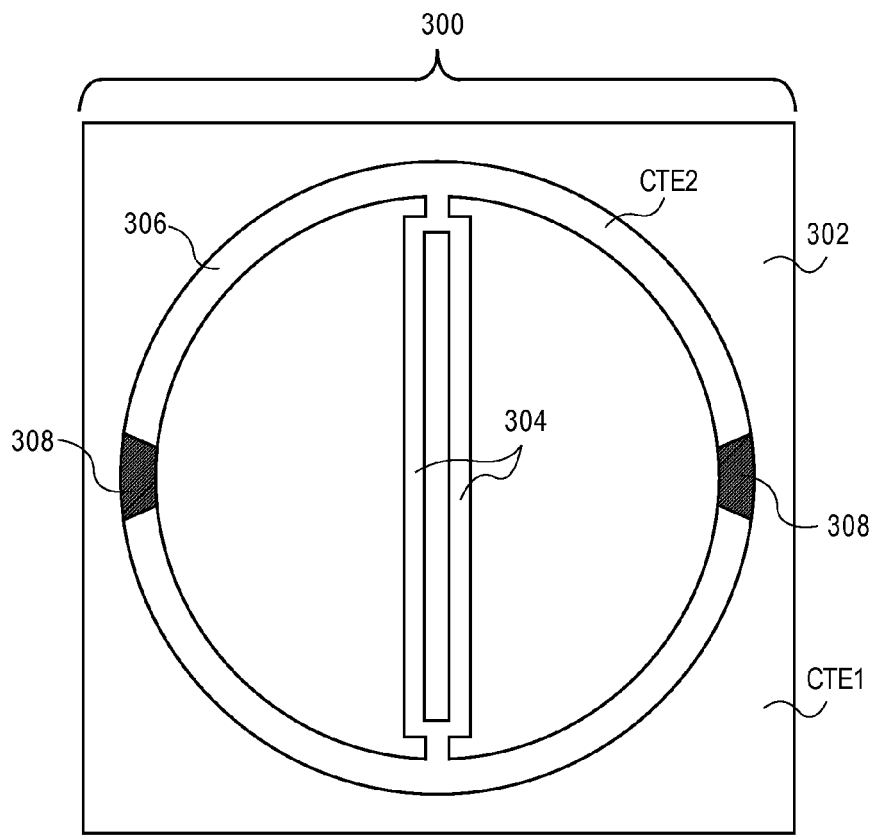
FIGS. 3A-B illustrate plan views representing a MEMS structure having a stress inverter temperature-compensated resonator member responding to an increase in temperature, in accordance with an embodiment of the present invention.
Figure 3B:
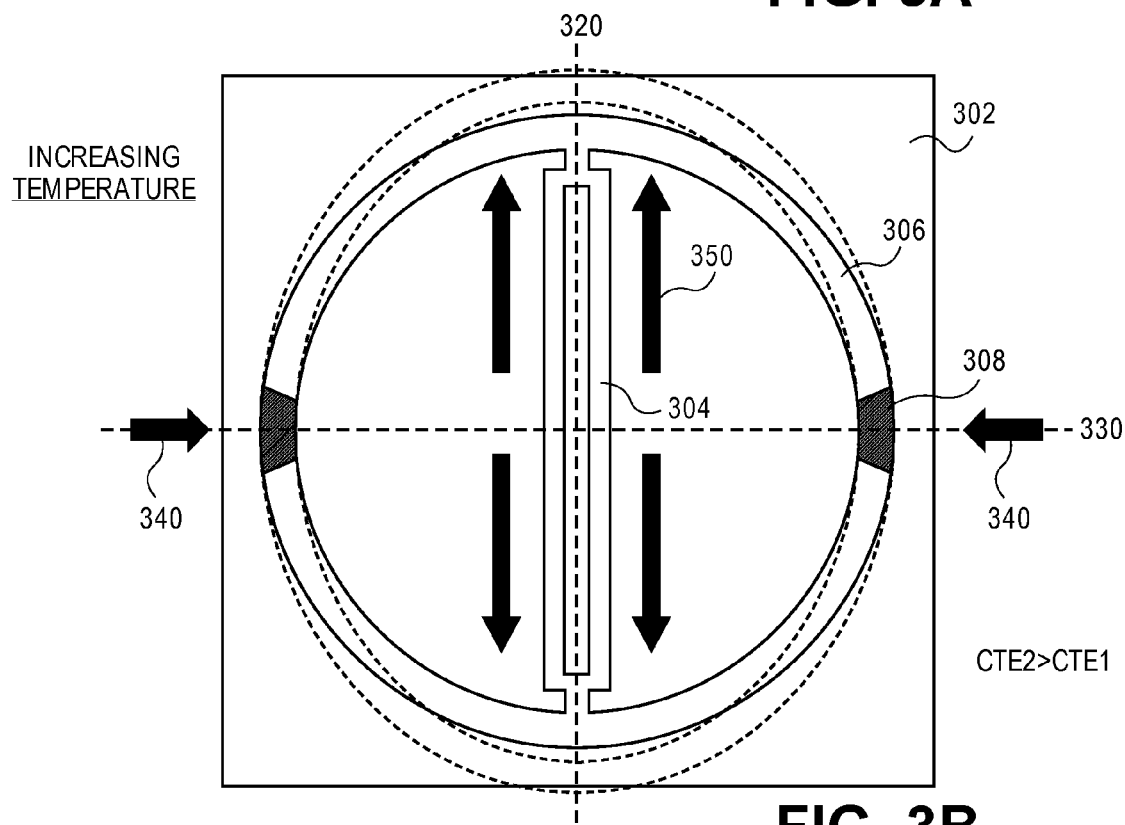

A stress inverter member may be used to compensate for the TCf of a resonator member in a MEMS structure. FIGS. 3A-B illustrate plan views representing a MEMS structure having a stress inverter temperature-compensated resonator member responding to an increase in temperature, in accordance with an embodiment of the present invention.

Referring to FIG. 3A, a MEMS structure 300 is formed on a substrate 302. MEMS structure 300 is comprised of a resonator member 304 suspended above substrate 302 and housed in a stress inverter member 306. Stress inverter member 306 is coupled with substrate 302 via anchors 308. For convenience, drive and/or sense electrodes are not depicted. In accordance with an embodiment of the present invention, the CTE of stress inverter member 306 (i.e. CTE2) is greater than the CTE of substrate 302 (i.e. CTE1). In a particular embodiment, stress inverter member 306, resonator member 304 and anchors 308 are comprised substantially of polycrystalline silicon-germanium and substrate 302 is comprised substantially of mono-crystalline silicon.

Referring to FIG. 3B, stress inverter member 306 anchored to substrate 302 at anchors 308 responds to an increasing temperature by deforming in shape, as depicted by the dashed oval shape. That is, the shape and positioning of a region of stress inverter member 306 is altered to accommodate the stress induced on a different region of stress inverter member 306. For example, in accordance with an embodiment of the present invention, stress inverter member 306 is anchored to substrate 302 via anchors 308 at two opposing points which form axis 330. As depicted by arrows 340, the CTE mismatch (CTE2>CTE1) results in a compressive stress induced on stress inverter member 306 in response to an increase in temperature. That is, substrate 302 effectively constrains the expansion of stress inverter 306.

The compressive stress induced along axis 330 deforms stress inverter member 306 along axis 320, wherein axis 320 is orthogonal to axis 330. This deformation of stress inverter member 306 induces a tensile stress on resonator member 304, as depicted by arrows 350. Thus, stress inverter member 306 inverts the compressive stress (i.e. the stress that would otherwise be experienced by a non-compensated resonator member) to a tensile stress induced on resonator member 304. In a specific embodiment, axis 320 is formed parallel to the longest dimension of resonator member 304 in order to maximize the tensile stress induced on resonator member 304, as depicted in FIG. 3B.

Stress inverter member 306 may be used to compensate a resonator member having a non-zero TCf. In accordance with an embodiment of the present invention, resonator member 304 has a negative TCf. In a specific embodiment, residual stress from the fabrication of resonator member 304 at above room-temperature process conditions increases the magnitude of the negative TCf. The resonance frequency of resonator member 304 may decrease in response to an increase in temperature. In one embodiment, the tensile stress induced by stress inverter member 306 on resonator member 304 acts to counter this otherwise decreasing resonance frequency in response to an increase in temperature. Thus, a temperature-compensated resonator member may be fabricated.

Figure 4A:
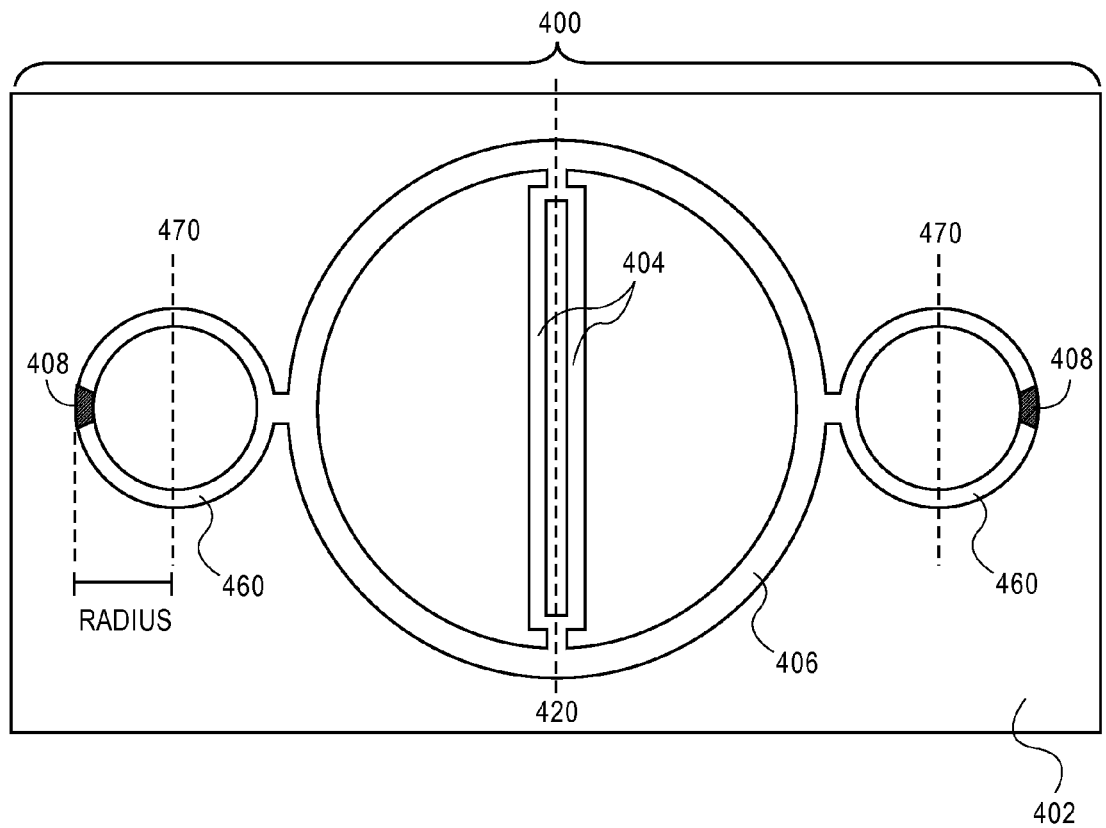
FIGS. 4A-B illustrate a plan view representing a MEMS structure having a partially decoupled stress inverter structure which contains a resonator member and a related correlation plot of frequency variation as a function of temperature, in accordance with an embodiment of the present invention.
Figure 4B:
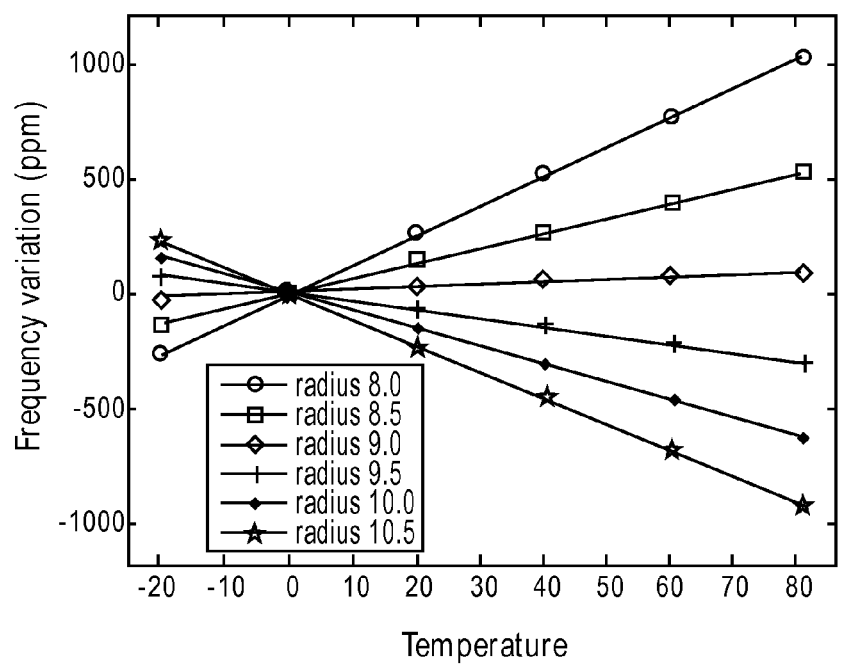

It may be the case that a stress inverter member overcompensates for the TCf of a resonator member. In such a case, the stress inverter member may need to be partially decoupled from the substrate, in order to achieve the desired magnitude of induced stress on the resonator member. FIGS. 4A-B illustrate a plan view representing a MEMS structure having a partially decoupled stress inverter structure which contains a resonator member and a related correlation plot of frequency variation as a function of temperature, in accordance with an embodiment of the present invention.

Referring to FIG. 4A, a MEMS structure 400 is formed on a substrate 402. MEMS structure 400 is comprised of a resonator member 404 suspended above substrate 402 and housed in a stress inverter member 406. A pair of decoupling members 460 is connected to either side of stress inverter member 406. The pair of decoupling members 460 is coupled with substrate 402 via anchors 408. For convenience, drive and/or sense electrodes are not depicted. In accordance with an embodiment of the present invention, the CTE of MEMS structure 400 is greater than the CTE of substrate 402. In a particular embodiment, stress inverter member 406, the pair of decoupling members 460, resonator member 404 and anchors 408 are comprised substantially of polycrystalline silicon-germanium and substrate 402 is comprised substantially of mono-crystalline silicon.

The pair of decoupling members 460 may be any feature suitable to decouple a portion of the stress induced by stress inverter member 406 on resonator member 404 in response to a change in temperature. Thus, in accordance with an embodiment of the present invention, the pair of decoupling members 460 is provided for reducing the magnitude of tensile stress induced on resonator member 404. In one embodiment, the pair of decoupling members 460 is a pair of rings, as depicted in FIG. 4A. The pair of decoupling members 460 may reduce the magnitude of the inverted stress induced by stress inverter member 406 on resonator member 404, in response to a changing temperature, by deforming along axes 470. That is, the deformation of the pair of decoupling members 460 reduces the extent of deformation of stress inverter member 406 along axis 420, thereby reducing the magnitude of the stress induced on resonator member 404.

Referring to FIG. 4B, the extent of reduction of inverted stress by the pair of decoupling members 460 is fine-tuned by altering the radius of the pair of decoupling members 460. FIG. 4B is a correlation plot of frequency variation of a stress inverter temperature-compensated resonator member as a function of temperature. In this example, the beam length of each of the beams of resonator member 404 is fixed at approximately 75 microns, the beam width is fixed at approximately 1.5 microns and the beam thickness is fixed at approximately 2 microns. For these dimensions, the anti-symmetric mode (the $11^{th}$ mode) of resonator member 404 has a frequency of approximately 1.51 MHz. The width of stress inverter member 406 is fixed at approximately 5 microns. The pair of decoupling members 460 is a pair of rings, each with a fixed width of approximately 1.5 microns. By varying the radius of each of the rings of the pair of decoupling members 460, the TCf of resonator member 404 may be adjusted to a desired value. Under the above conditions, the TCf of resonator member 404 varies from −12.7 ppm/° C. at a decoupling ring radius of 8 microns to +11.8 ppm/° C. at a decoupling ring radius of 10.5 microns, as depicted in FIG. 4B. Furthermore, under the above conditions, the TCf of resonator member 404 is approximately −1 ppm/° C. at a decoupling ring radius of 9 microns. Thus, in accordance with an embodiment of the present invention, stress inverter member 406 as fine-tuned with the pair of decoupling members 460 substantially compensates, i.e. cancels out, the otherwise negative TCf of resonator member 404.

Figure 5A:
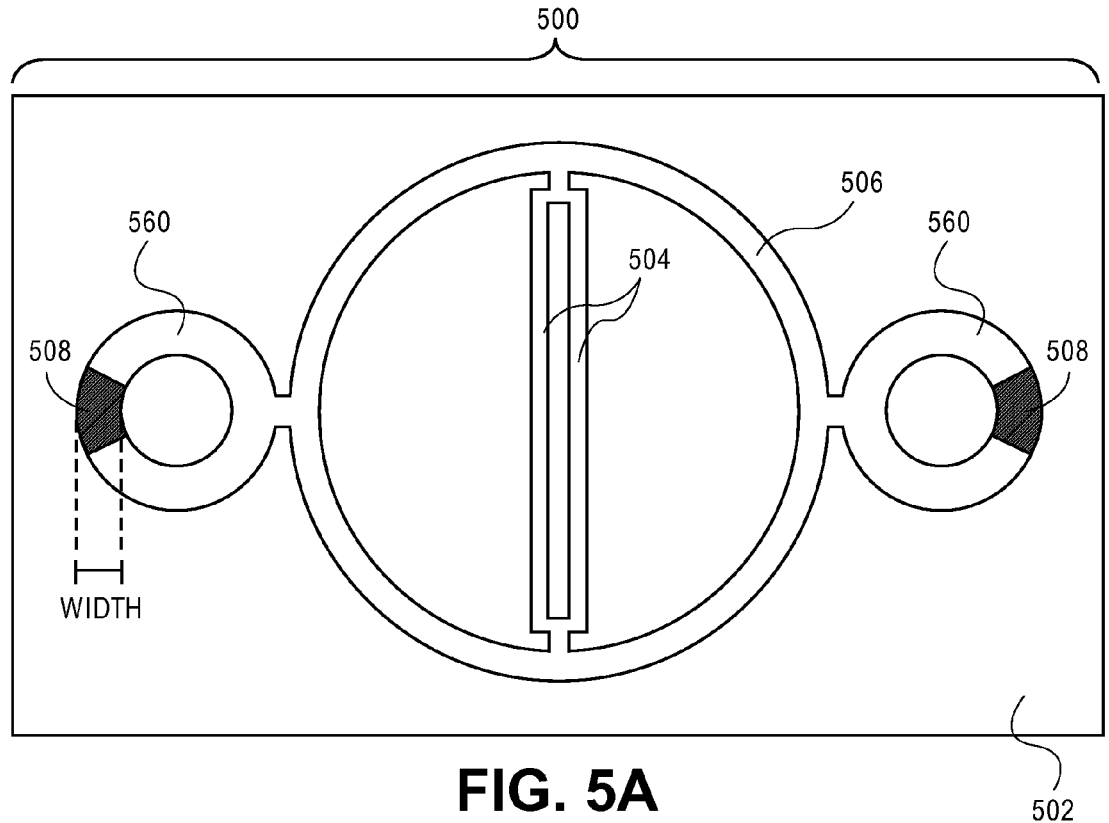
FIGS. 5A-B illustrate a plan view representing a MEMS structure having a stress inverter temperature-compensated resonator member and a related correlation plot of frequency variation as a function of temperature, in accordance with an embodiment of the present invention.
Figure 5B:
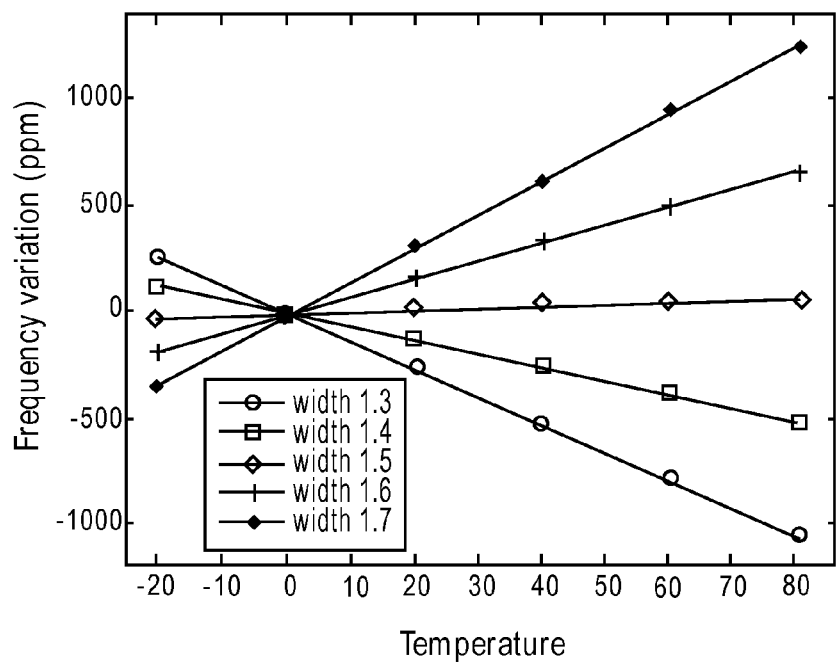

The magnitude of inverted stress induced on a resonator member may also be fine-tuned by varying the width of a pair of decoupling members. FIGS. 5A-B illustrate a plan view representing a MEMS structure having a stress inverter temperature-compensated resonator member and a related correlation plot of frequency variation as a function of temperature, in accordance with an embodiment of the present invention.

Referring to FIG. 5A, a MEMS structure 500 is formed on a substrate 502. MEMS structure 500 is comprised of a resonator member 504 suspended above substrate 502 and housed in a stress inverter member 506. A pair of decoupling members 560 is connected to either side of stress inverter member 506. The pair of decoupling members 560 is coupled with substrate 502 via anchors 508. For convenience, drive and/or sense electrodes are not depicted. The CTE of MEMS structure 500 is greater than the CTE of substrate 502. In a particular embodiment, stress inverter member 506, the pair of decoupling members 560, resonator member 504 and anchors 508 are comprised substantially of polycrystalline silicon-germanium and substrate 502 is comprised substantially of mono-crystalline silicon.

Referring to FIG. 5B, the extent of reduction of inverted stress by the pair of decoupling members 560 is fine-tuned by altering the width of the pair of decoupling members 560. FIG. 5B is a correlation plot of frequency variation of a stress inverter temperature-compensated resonator member as a function of temperature. In this example, the beam dimensions for resonator member 504 are the same as those described for the beam dimensions of resonator member 404 from FIG. 4. The width of stress inverter member 506 is also fixed at approximately 5 microns. The pair of decoupling members 560 is a pair of rings, each with a fixed radius of approximately 9 microns. By varying the width of each of the rings of the pair of decoupling members 560, the TCf of resonator member 504 may be adjusted to a desired value. Under the above conditions, the TCf of resonator member 504 varies from a negative value at a decoupling ring width of 1.3 microns to a positive value at a decoupling ring width of 1.7 microns, as depicted in FIG. 4B. Thus, in accordance with an embodiment of the present invention, stress inverter member 506 is fine-tuned, with the pair of decoupling members 560 adjusting the TCf of resonator member 504.

Figure 6A:
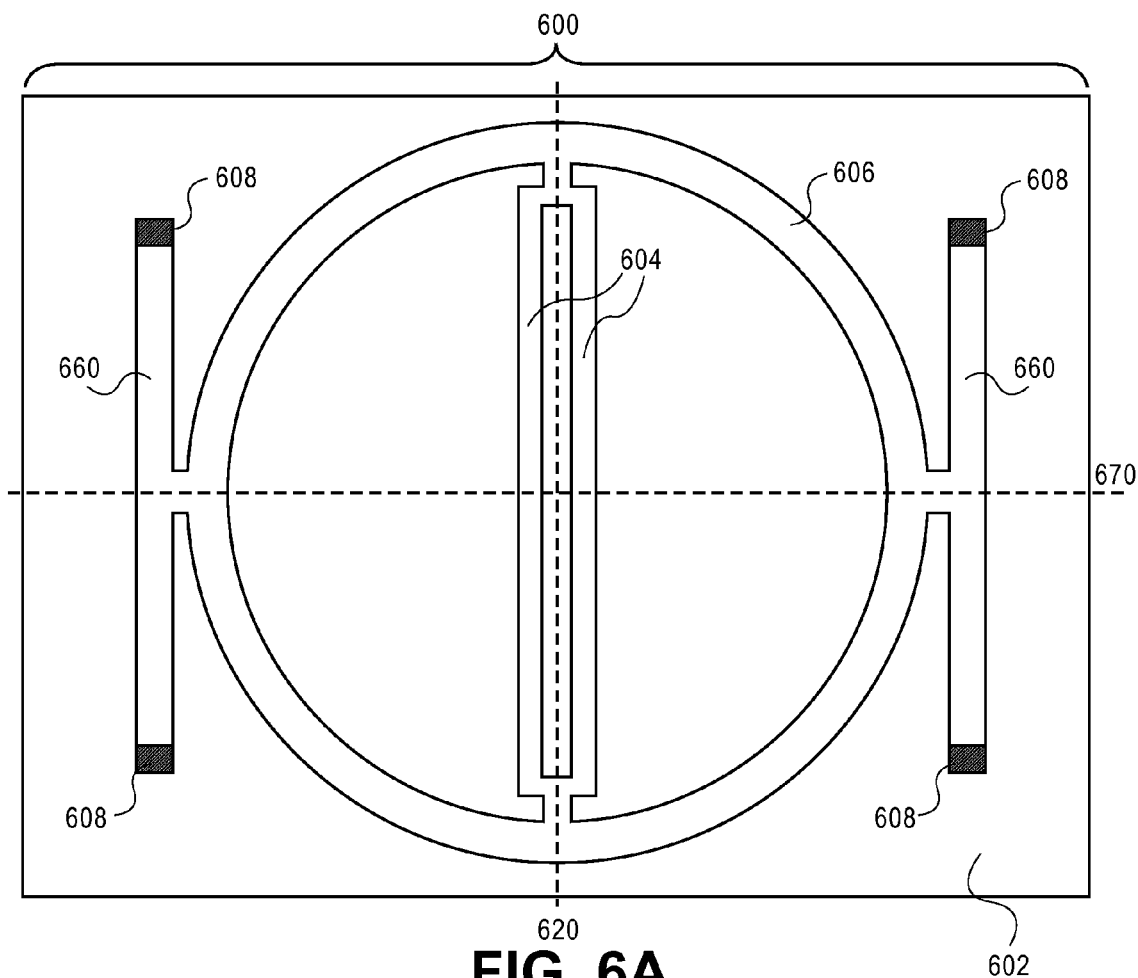
FIGS. 6A-B illustrate a plan view representing a MEMS structure having a stress inverter temperature-compensated resonator member and a related correlation plot of frequency variation as a function of temperature, in accordance with an embodiment of the present invention.
Figure 6B:
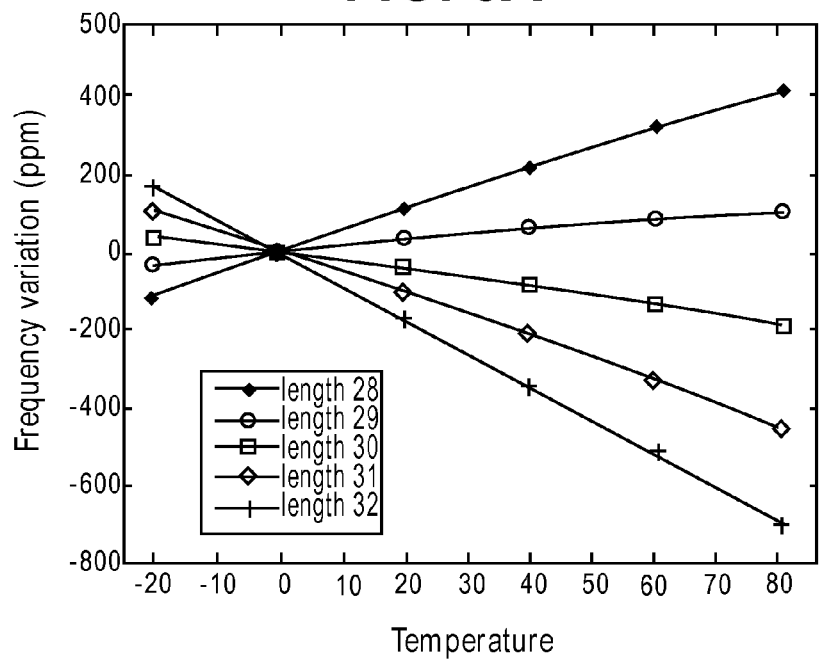

The magnitude of inverted stress induced on a resonator member may also be fine-tuned by a pair of decoupling beams. FIGS. 6A-B illustrate a plan view representing a MEMS structure having a stress inverter temperature-compensated resonator member and a related correlation plot of frequency variation as a function of temperature, in accordance with an embodiment of the present invention.

Referring to FIG. 6A, a MEMS structure 600 is formed on a substrate 602. MEMS structure 600 is comprised of a resonator member 604 suspended above substrate 602 and housed in a stress inverter member 606. A pair of decoupling members 660 is connected to either side of stress inverter member 606. The pair of decoupling members 660 is coupled with substrate 602 via anchors 608. For convenience, drive and/or sense electrodes are not depicted. The CTE of MEMS structure 600 is greater than the CTE of substrate 602. In a particular embodiment, stress inverter member 606, the pair of decoupling members 660, resonator member 604 and anchors 608 are comprised substantially of polycrystalline silicon-germanium and substrate 602 is comprised substantially of mono-crystalline silicon.

The pair of decoupling members 660 may be any feature suitable to decouple a portion of the stress induced by stress inverter member 606 on resonator member 604 in response to a change in temperature. Thus, in accordance with an embodiment of the present invention, the pair of decoupling members 660 is provided for reducing the magnitude of tensile stress induced on resonator member 604. In one embodiment, the pair of decoupling members 660 is a pair of beams, as depicted in FIG. 6A. The pair of decoupling members 660 may reduce the magnitude of the inverted stress induced by stress inverter member 606 on resonator member 404 in response to a changing temperature by deforming along axis 670. That is, the deformation of the pair of decoupling members 660 reduces the extent of deformation of stress inverter member 606 along axis 620, reducing the magnitude of the stress induced on resonator member 604. Thus, in accordance with an embodiment of the present invention, the pair of decoupling beams 660 act as a pair of linear springs. When subjected to a point load in the center, each beam has a linear spring constant $k_{linear}=192\ EI/L^3$, where $I=w^3h/12$ (L is the length, w is the width and h is the thickness of the beam). That is, the variable w refers to the dimension of the spring 660 in the direction of axis 670, while the variable h refers to its thickness in the direction perpendicular to substrate 602.

Referring to FIG. 6B, the extent of reduction of inverted stress by the pair of decoupling members 660 is fine-tuned by altering the length of the pair of decoupling members 660. FIG. 6B is a correlation plot of frequency variation of a stress inverter temperature-compensated resonator member as a function of temperature. In this example, the beam dimensions for resonator member 604 are the same as those described for the beam dimensions of resonator member 404 from FIG. 4. The width of stress inverter member 606 is also fixed at approximately 5 microns. The pair of decoupling members 660 is a pair of beams, each with a fixed width of approximately 1.5 microns. By varying the length of each of the beams of the pair of decoupling members 660, the TCf of resonator member 604 may be adjusted to a desired value. Under the above conditions, the TCf of resonator member 604 varies from a negative value at a decoupling beam length of 32 microns to a positive value at a decoupling beam length of 28 microns, as depicted in FIG. 6B. Thus, in accordance with an embodiment of the present invention, stress inverter member 606 is fine-tuned, with the pair of decoupling members 660 adjusting the TCf of resonator member 604.

A MEMS structure may comprise an array of resonator members housed in stress inverter members. FIG. 7 illustrates a top-down view representing an n by m array of MEMS structures having stress inverter temperature-compensated resonator members, in accordance with an embodiment of the present invention.

Referring to FIG. 7, an array of MEMS resonators comprises n rows and m columns of stress inverter members suspended above a substrate. Each stress inverter member houses a resonator member and is connected to a pair of decoupling members coupled with the substrate. Each row of the array of MEMS resonators may have nominally identical room-temperature frequencies and systematically varying TCfs. Thus, in accordance with an embodiment of the present invention, the diameter of each stress inverter member is the same within each row of stress inverter members but increases for each successive row of stress inverter members. Furthermore, each pair of decoupling members is a pair of rings, wherein the radius of each pair of rings is the same within each column of stress inverter members but increases for each successive column of stress inverter members, as depicted in FIG. 7. That is, the resonance frequency of each MEMS resonator in the array decreases from top to bottom, while the TCf decreases from left to right. In an alternative embodiment, each pair of decoupling members is a pair of beams, wherein the length of each pair of beams is the same within each column of stress inverter members but increases for each successive column of stress inverter members.

Thus, an array of MEMS resonators with systematically varying TCfs may be formed. In accordance with an embodiment of the present invention, using a MEMS structure comprising an array of MEMS resonators ensures that a device having such an array will always comprise a MEMS resonator with a target frequency and TCf. In another embodiment, a MEMS structure comprising an array of MEMS resonators is used for the temperature calibration of sensors and other electronic systems. In a specific embodiment, a sparse array of MEMS resonators is used, i.e. not every point (n,m) of the array has a dedicated MEMS resonator.

Figure 8A:
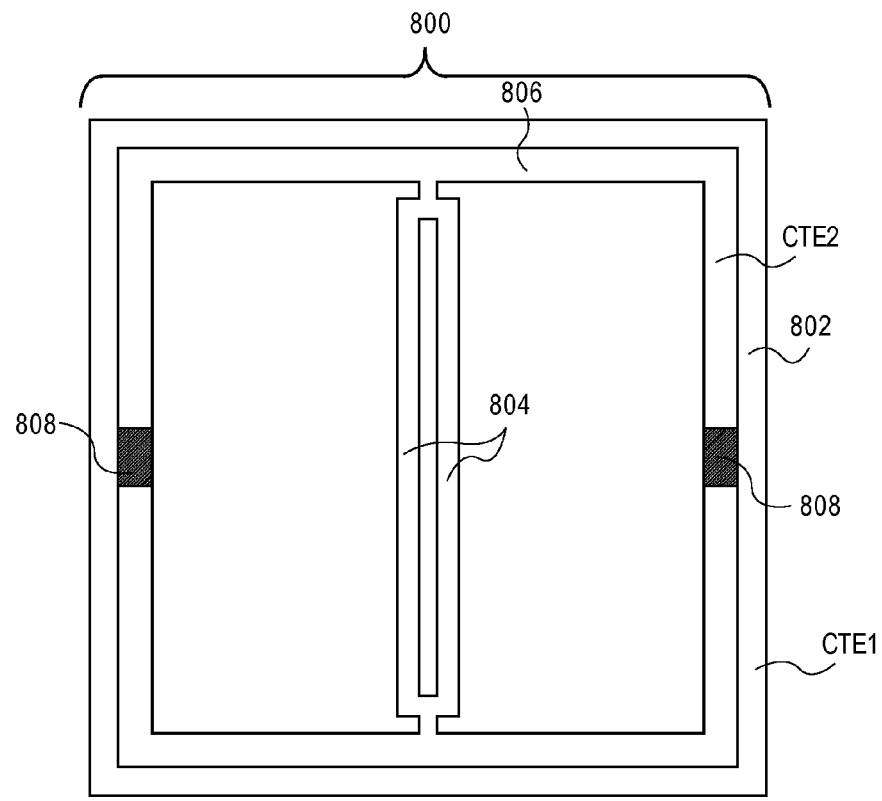
FIGS. 8A-B illustrate plan views representing a MEMS structure having a stress inverter temperature-compensated resonator member responding to an increase in temperature, in accordance with an embodiment of the present invention.
Figure 8B:
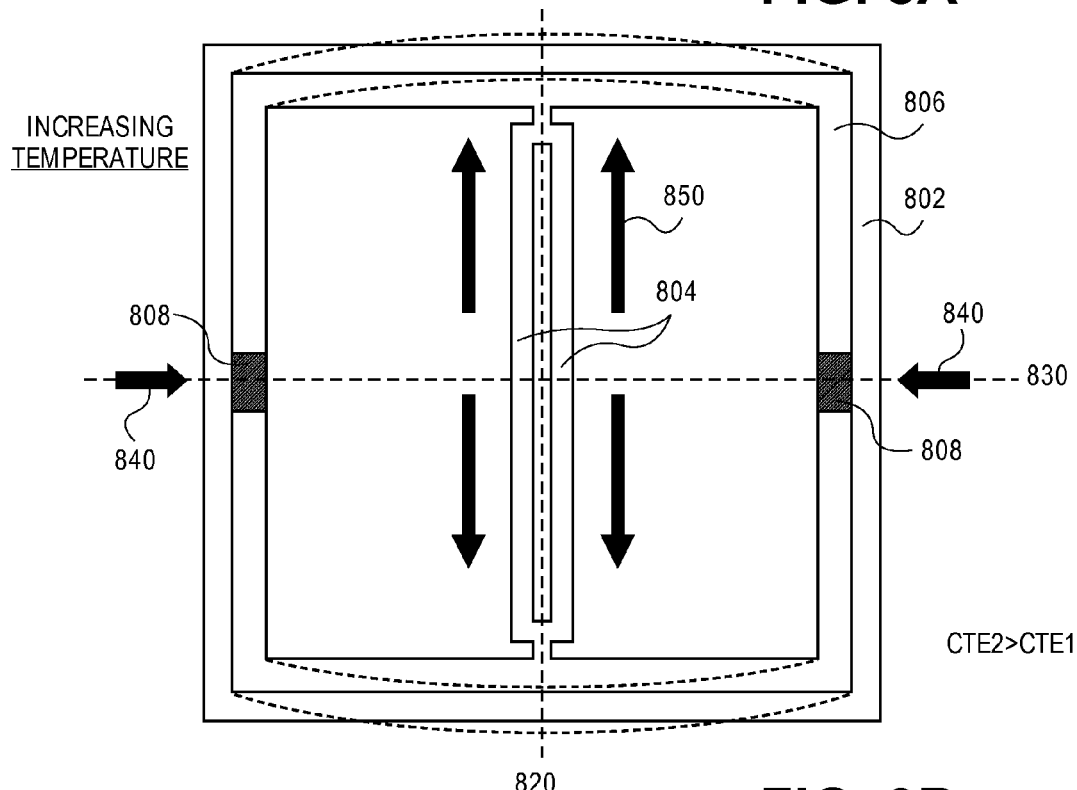

The shape of a stress inverter member is not limited to that of a ring. In an alternative embodiment, a stress inverter has the shape of a square frame. FIGS. 8A-B illustrate plan views representing a MEMS structure having a stress inverter temperature-compensated resonator member responding to an increase in temperature, in accordance with an embodiment of the present invention.

Referring to FIG. 8A, a MEMS structure 800 is formed on a substrate 802. MEMS structure 800 is comprised of a resonator member 804 suspended above substrate 802 and housed in a stress inverter member 806. Stress inverter member 806 is coupled with substrate 802 via anchors 808. For convenience, drive and/or sense electrodes are not depicted. In accordance with an embodiment of the present invention, the CTE of stress inverter member 806 (i.e. CTE2) is greater than the CTE of substrate 802 (i.e. CTE1). In a particular embodiment, stress inverter member 806, resonator member 804 and anchors 808 are comprised substantially of polycrystalline silicon-germanium and substrate 802 is comprised substantially of mono-crystalline silicon.

Referring to FIG. 8B, stress inverter member 806 having a square frame shape responds to an increasing temperature by deforming in shape, as depicted by the dashed bent shape. That is, the shape and positioning of a region of stress inverter member 806 is altered to accommodate the stress induced on a different region of stress inverter member 806. For example, in accordance with an embodiment of the present invention, stress inverter member 806 is anchored to substrate 802 via anchors 808 at two opposing points which form axis 830. As depicted by arrows 840, the CTE mismatch (CTE2>CTE1) results in a compressive stress induced on stress inverter member 806 in response to an increase in temperature. That is, substrate 802 effectively constrains the expansion of stress inverter member 806 along axis 830.

The compressive stress induced along axis 830 deforms stress inverter member 806 along axis 820, wherein axis 820 is orthogonal to axis 830. This deformation of stress inverter member 806 induces a tensile stress on resonator member 804, as depicted by arrows 850. Thus, stress inverter member 806 inverts the compressive stress (i.e. the stress that would otherwise be experienced by a non-compensated resonator member) to a tensile stress induced on resonator member 804. In a specific embodiment, axis 820 is formed parallel to the longest dimension of resonator member 804 in order to maximize the tensile stress induced on resonator member 804, as depicted in FIG. 8B.

Stress inverter member 806 having a square frame shape may be used to compensate a resonator member 804 having a negative TCf. In a specific embodiment, residual stress from the fabrication of resonator member 804 at above room-temperature process conditions increases the magnitude of the negative TCf. The resonance frequency of resonator member 804 may decrease in response to an increase in temperature. In one embodiment, the tensile stress induced by stress inverter member 806 on resonator member 804 acts to counter this otherwise decreasing resonance frequency in response to an increase in temperature. Thus, a temperature-compensated resonator member housed in a square frame-shaped stress inverter member may be fabricated. In a specific embodiment, a MEMS structure having a square frame-shaped stress inverter member also incorporates a pair of decoupling members to decouple a portion of the stress induced by the stress inverter member on a resonator member in response to a change in temperature.

Figure 9A:
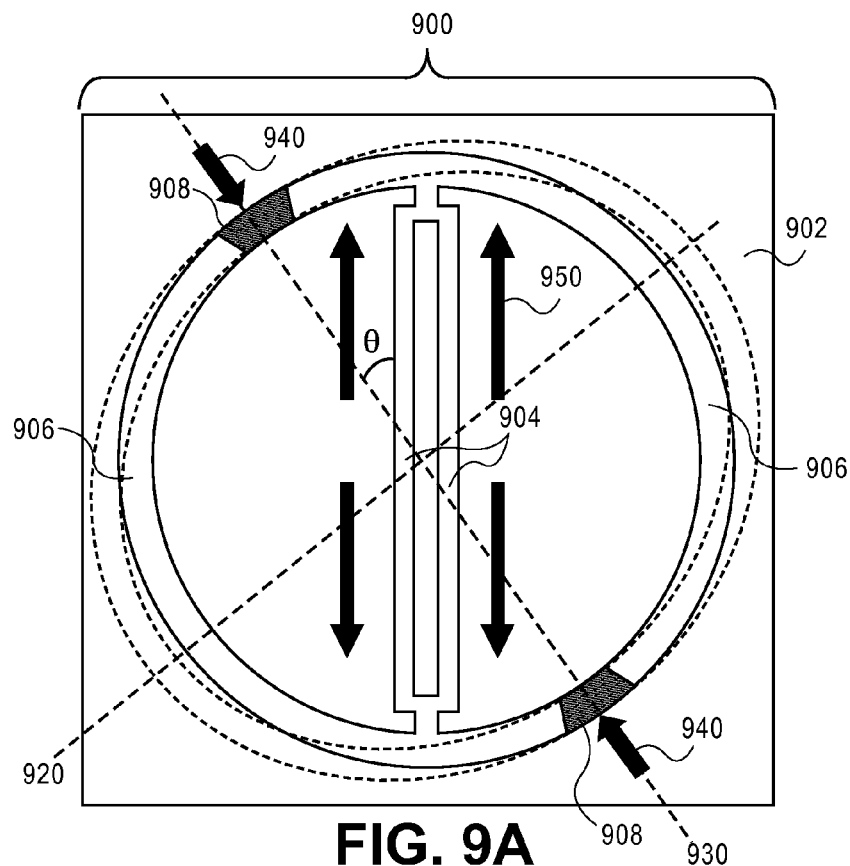
FIGS. 9A-B illustrate plan views representing MEMS structures having stress inverter temperature-compensated resonator members, in accordance with an embodiment of the present invention.
Figure 9B:
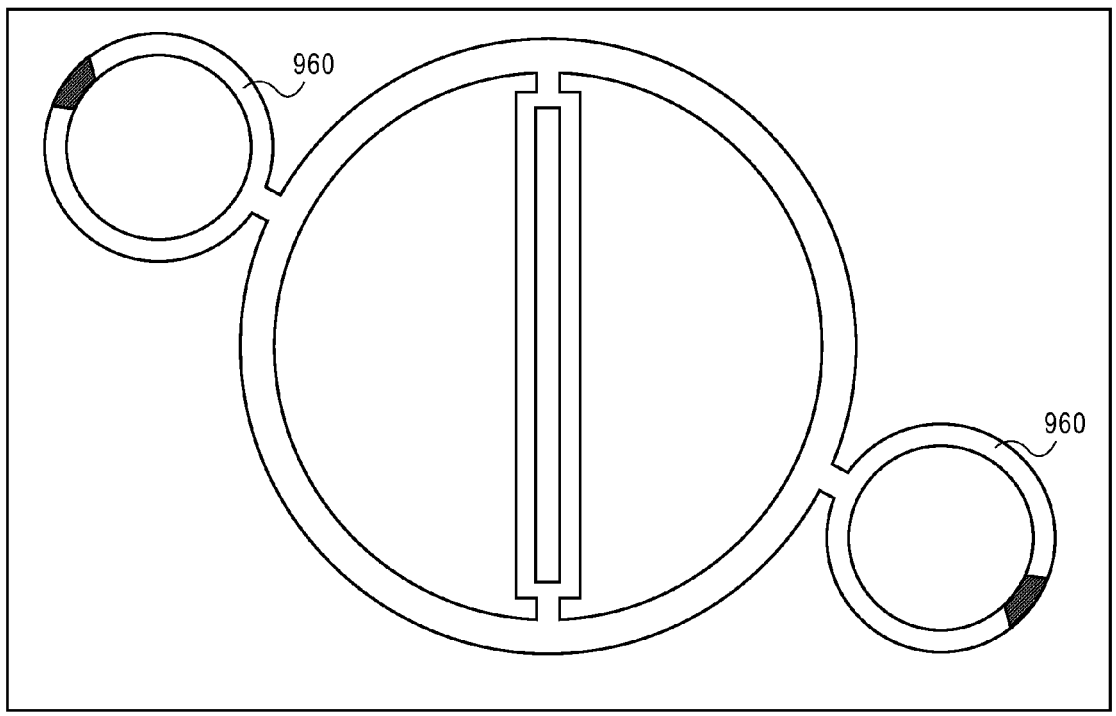

The axis of deformation of a stress inverter member need not be aligned in parallel with the longest dimension of a resonator member. FIGS. 9A-B illustrate plan views representing MEMS structures having stress inverter temperature-compensated resonator members, in accordance with an embodiment of the present invention.

Referring to FIG. 9A, a MEMS structure 900 is formed on a substrate 902. MEMS structure 900 is comprised of a resonator member 904 suspended above substrate 902 and housed in a stress inverter member 906. Stress inverter member 906 is coupled with substrate 902 via anchors 908. For convenience, drive and/or sense electrodes are not depicted. In accordance with an embodiment of the present invention, the CTE of stress inverter member 906 is greater than the CTE of substrate 902. In a particular embodiment, stress inverter member 906, resonator member 904 and anchors 908 are comprised substantially of polycrystalline silicon-germanium and substrate 902 is comprised substantially of mono-crystalline silicon.

Referring again to FIG. 9A, stress inverter member 906 responds to an increasing temperature by deforming in shape, as depicted by the dashed oval shape. That is, the shape and positioning of a region of stress inverter member 906 is altered to accommodate the stress induced on a different region of stress inverter member 906. For example, in accordance with an embodiment of the present invention, stress inverter member 906 is anchored to substrate 902 via anchors 908 at two opposing points which form axis 930. As depicted by arrows 940, the CTE mismatch results in a compressive stress induced on stress inverter member 906 in response to an increase in temperature. That is, substrate 902 effectively constrains the expansion of stress inverter 906.

The compressive stress induced along axis 930 deforms stress inverter member 906 along axis 920, wherein axis 920 is orthogonal to axis 930. This deformation of stress inverter member 906 induces a tensile stress on resonator member 904, as depicted by arrows 950. Thus, stress inverter member 906 inverts the compressive stress (i.e. the stress that would otherwise be experienced by a non-compensated resonator member) to a tensile stress induced on resonator member 904. In one embodiment, axis 920 is aligned with an angle θ relative to the longest dimension of resonator member 904, wherein 0°<θ<90°, as depicted in FIG. 9A. That is, in accordance with an embodiment of the present invention, the direction of the deformation of a stress inverter member is aligned skewed to the longest dimension of a resonator member in order to select the desired magnitude of the tensile stress induced on the resonator member. In a specific embodiment, a MEMS structure having a skewed stress inverter member also incorporates a pair of decoupling members 960 to decouple a portion of the stress induced by the stress inverter member on a resonator member in response to a change in temperature, as depicted in FIG. 9B.

Figure 10A:
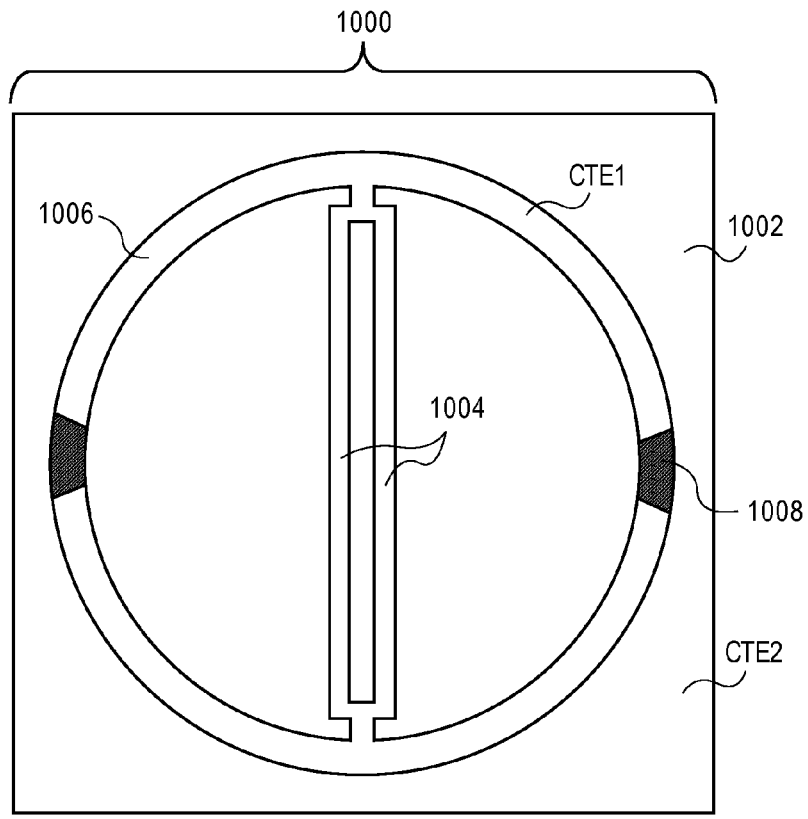
FIGS. 10A-B illustrate plan views representing a MEMS structure having a stress inverter temperature-compensated resonator member responding to an increase in temperature, in accordance with an embodiment of the present invention.
Figure 10B:
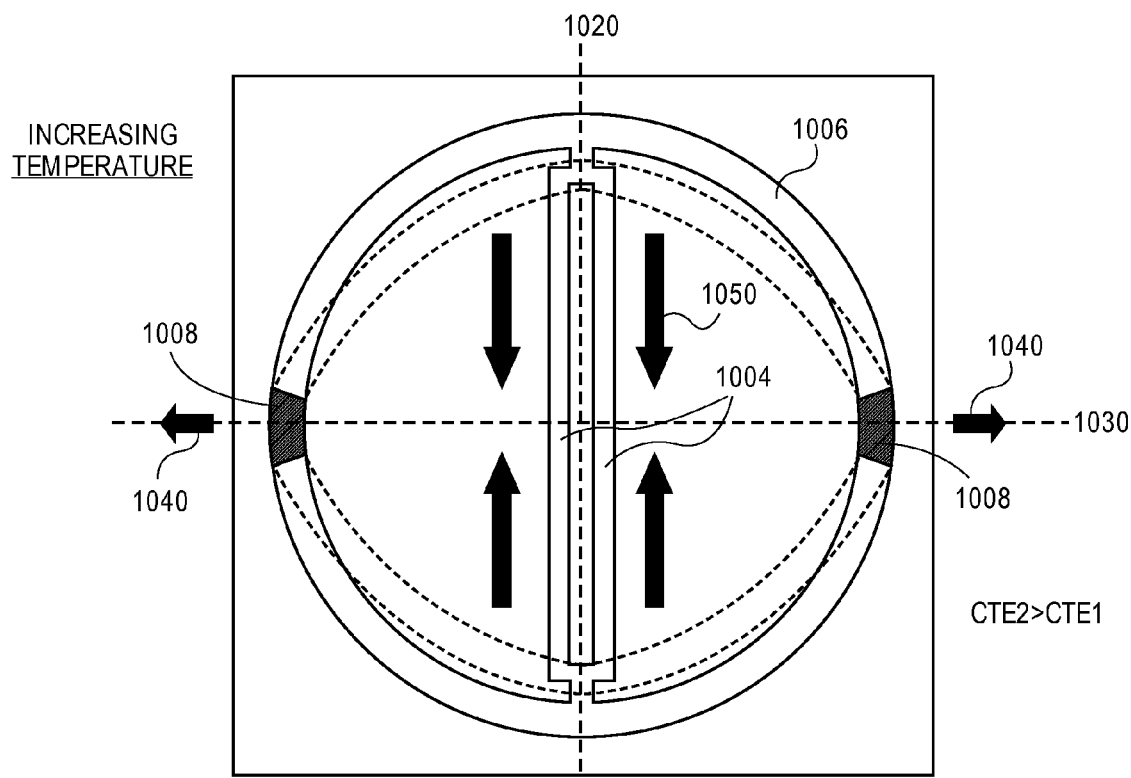

A stress inverter member may also be used to compensate for a positive TCf of a resonator member in a MEMS structure. FIGS. 10A-B illustrate plan views representing a MEMS structure having a stress inverter temperature-compensated resonator member responding to an increase in temperature, in accordance with an embodiment of the present invention.

Referring to FIG. 10A, a MEMS structure 1000 is formed on a substrate 1002. MEMS structure 1000 is comprised of a resonator member 1004 suspended above substrate 1002 and housed in a stress inverter member 1006. Stress inverter member 1006 is coupled with substrate 1002 via anchors 1008. For convenience, drive and/or sense electrodes are not depicted. In accordance with an embodiment of the present invention, the CTE of stress inverter member 1006 (i.e. CTE1) is less than the CTE of substrate 1002 (i.e. CTE2). In a particular embodiment, stress inverter member 1006, resonator member 1004 and anchors 1008 are comprised substantially of diamond and substrate 1002 is comprised substantially of amorphous silicon dioxide.

Referring to FIG. 10B, stress inverter member 1006 responds to an increasing temperature by deforming in shape, as depicted by the dashed oval shape. That is, the shape and positioning of a region of stress inverter member 1006 is altered to accommodate the stress induced on a different region of stress inverter member 1006. For example, in accordance with an embodiment of the present invention, stress inverter member 1006 is anchored to substrate 1002 via anchors 1008 at two opposing points which form axis 1030. As depicted by arrows 1040, the CTE mismatch (CTE2>CTE1) results in a tensile stress induced on stress inverter member 1006 in response to an increase in temperature. That is, substrate 1002 effectively forces the expansion of stress inverter 1006.

The tensile stress induced along axis 1030 deforms stress inverter member 1006 along axis 1020, wherein axis 1020 is orthogonal to axis 1030. This deformation of stress inverter member 1006 induces a compressive stress on resonator member 1004, as depicted by arrows 1050. Thus, stress inverter member 1006 inverts the tensile stress (i.e. the stress that would otherwise be experienced by a non-compensated resonator member) to a compressive stress induced on resonator member 1004. In a specific embodiment, axis 1020 is formed parallel to the longest dimension of resonator member 1004 in order to maximize the compressive stress induced on resonator member 1004, as depicted in FIG. 10B. In an alternative embodiment, the direction of the deformation of the stress inverter member is aligned skewed to the longest dimension of the resonator member in order to select the desired magnitude of the compressive stress induced on the resonator member. In a particular embodiment, the MEMS structure also incorporates a pair of decoupling members to decouple a portion of the compressive stress induced by the stress inverter member on the resonator member in response to a change in temperature.

Stress inverter member 1006 may be used to compensate a resonator member having a positive TCf. Thus, in accordance with an embodiment of the present invention, the resonance frequency of resonator member 1004 increases in response to an increase in temperature. In one embodiment, the compressive stress induced by stress inverter member 1006 on resonator member 1004 acts to counter this otherwise increasing resonance frequency in response to an increase in temperature. Thus, a temperature-compensated resonator member may be formed.

In another aspect of the present invention, it may be desirable to partially decouple an inverter member from a substrate, in order to reduce the effective stress applied to a resonator member housed in the inverter member. However, the incorporation of decoupling members into a MEMS structure including an inverter member, as described in association with FIGS. 4A, 5A, 6A and 9B, may not always be feasible when considering space-constraints in the lay-out of the MEMS structure. Instead, an asymmetric frame, e.g. a frame having a major axis and a minor axis, may be used as a stress inverter member to house a resonator member. For example, FIG. 11 illustrates a plan view representing a MEMS structure having an elliptical stress inverter member housing a resonator member, in accordance with an embodiment of the present invention.

Figure 11:
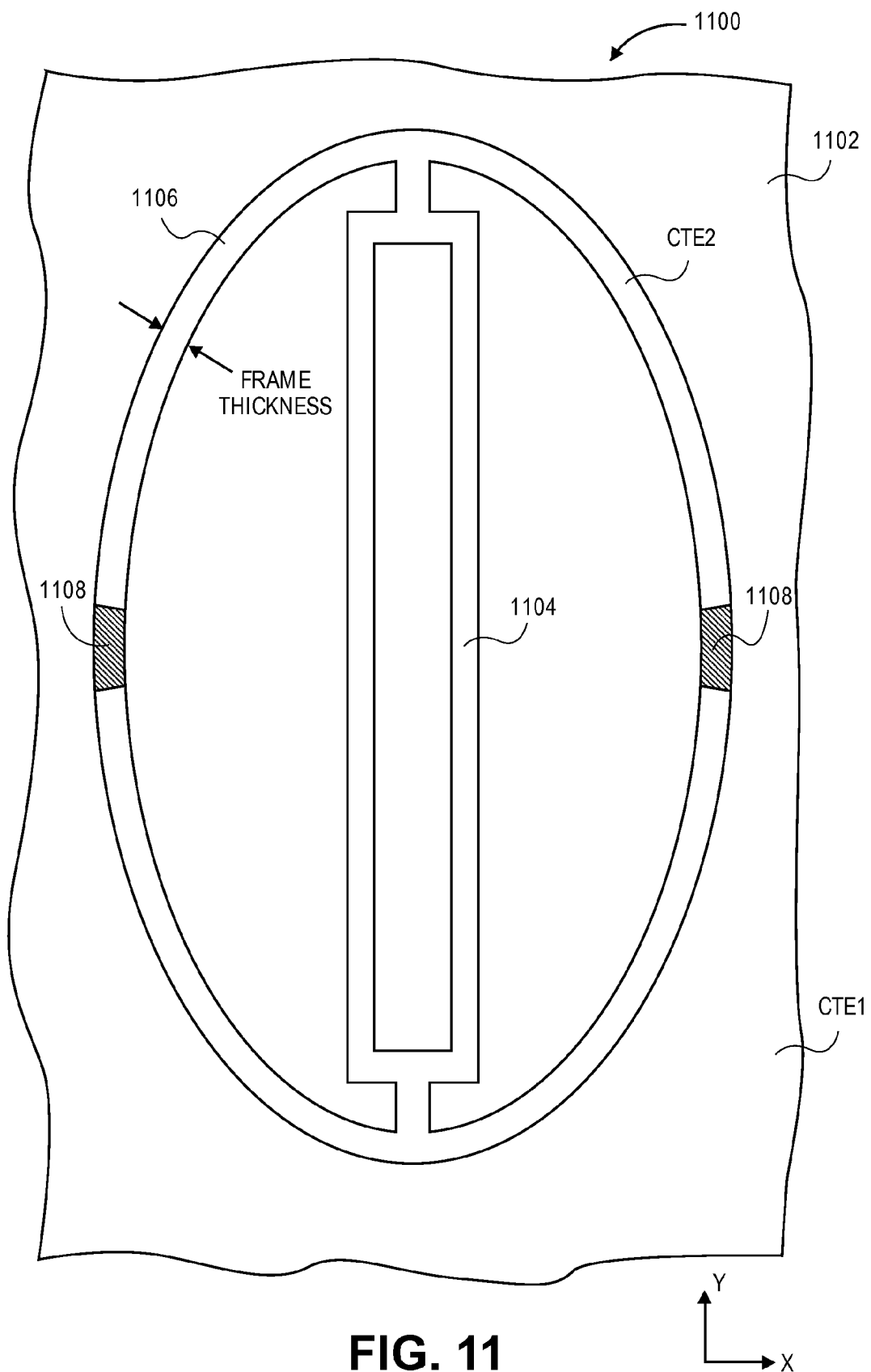
FIG. 11 illustrates a plan view representing a MEMS structure having an elliptical stress inverter member housing a resonator member, in accordance with an embodiment of the present invention.

Referring to FIG. 11, a MEMS structure 1100 is disposed above a substrate 1102. MEMS structure 1100 includes a resonator member 1104 housed in an asymmetric stress inverter member 1106 coupled to substrate 1102. Resonator member 1104 is suspended above substrate 1102. A pair of driver and sensor electrodes, not shown, may be included on either side of resonator member 1104. In accordance with an embodiment of the present invention, asymmetric stress inverter member 1106 is an elliptical frame, as depicted in FIG. 11. In an embodiment, the elliptical frame is directly coupled to substrate 1102 by a pair of anchor points 1108. In one embodiment, the elliptical frame is oriented to have its major axis along the Y-axis and parallel with the longest dimension of resonator member 1104, as is also depicted in FIG. 11. In that embodiment, the pair of anchor points 1108 is arranged orthogonally to the Y-axis and at the mid-point of the major axis, i.e. along the X-axis and parallel with the minor axis of the elliptical frame.

The CTE of asymmetric stress inverter member 1106 (CTE2) may be greater than the CTE of substrate 1102 (CTE1). For example, in an embodiment, asymmetric stress inverter member 1106 is composed of silicon-germanium and substrate 1102 is composed of silicon. In accordance with an embodiment of the present invention, the TCf of resonator member 1104 is negative. In an embodiment, asymmetric stress inverter member 1106 is provided to induce a tensile stress on resonator member 1104 in response to an increase in temperature. For example, a method for altering the TCf of a MEMS structure may be performed. In one embodiment, the method includes providing a resonator member housed in an asymmetric frame coupled to a substrate, wherein the resonator member is suspended above the substrate. The CTE of the asymmetric frame is different from the CTE of the substrate. The method includes next applying a first stress to the asymmetric frame. In response to applying the first stress, the asymmetric frame applies a second, opposite, stress to the resonator member. In the case where the TCf of resonator member 1104 is negative, in response to a compressive (first) stress applied to stress inverter member 1106 due to CTE mismatch with substrate 1102, stress inverter member 1106 deforms by expanding along the major axis (Y-axis) to provide a tensile (second) stress on resonator member 1104. In an embodiment, the tensile stress reduces the magnitude of the TCf of resonator member 1104. In a specific embodiment, the tensile stress essentially negates the TCf of resonator member 1104. In an embodiment, resonator member 1104 is composed of approximately the same material as asymmetric stress inverter member 1106, e.g. both resonator member 1104 and asymmetric stress inverter member 1106 may be composed of silicon-germanium while substrate 1102 may be composed of silicon. In another embodiment, resonator member 1104 is completely surrounded by stress inverter member 1106, e.g., resonator member 1104 is completely surrounded by the elliptical frame, as depicted in FIG. 11.

By using an asymmetric frame, such as the elliptical frame describe above, versus a symmetrical frame, such as the ring or square-shaped frames also described above, the magnitude of stress applied to a resonator member housed therein may be mitigated with respect to the stress applied to a frame due to CTE mismatch with an underlying substrate. That is, in accordance with an embodiment of the present invention, an asymmetric frame is utilized to partially decouple the effect of the substrate and stress inverter CTE mismatch. However, the specific dimensions of the asymmetric frame may be selected to fine-tune such partial decoupling. For example, FIGS. 12A-12B are correlation plots representing frequency variation as a function of temperature for a MEMS structure having an elliptical stress inverter member housing a resonator member, in accordance with an embodiment of the present invention.

Figure 12A:
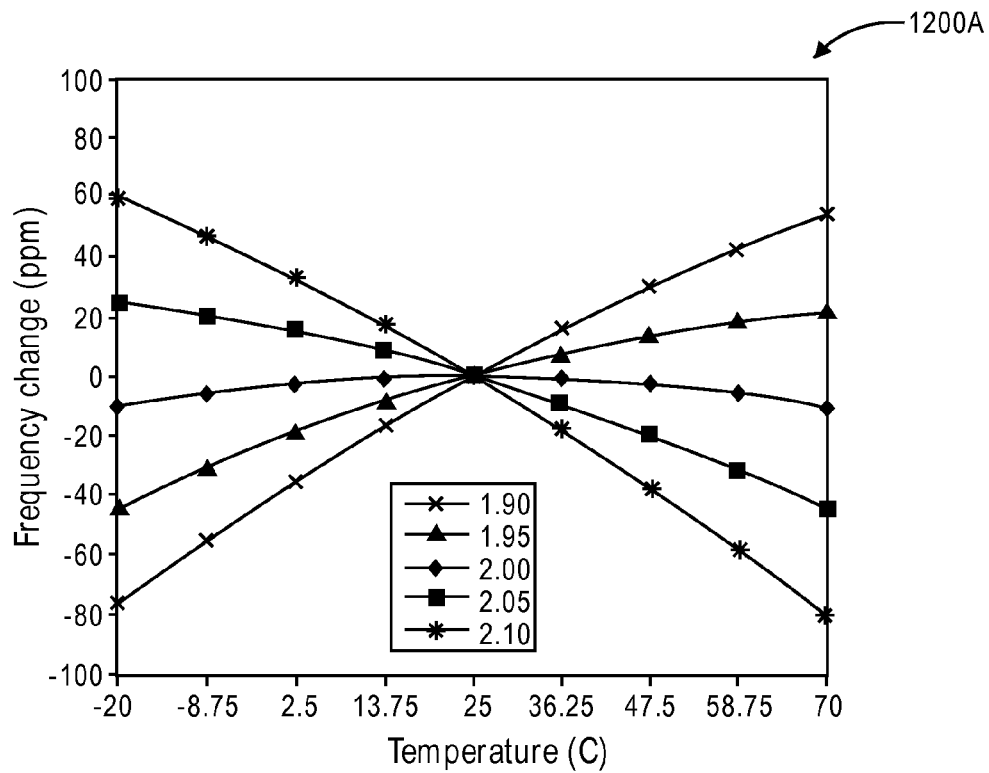
FIGS. 12A-12B are correlation plots representing frequency variation as a function of temperature for a MEMS structure having an elliptical stress inverter member housing a resonator member, in accordance with an embodiment of the present invention.

Referring to FIG. 12A, the temperature response is provided for the frequency of a resonator member, housed in an elliptical frame, as a function of the ratio of the Y-over-X parameters (major/minor axes shown in FIG. 11) for a variety of ellipse geometries. In this example, the resonator member is a double-ended tuning-fork. Correlation plot 1200A plots several correlations for major/minor axes (Y-over-X) elliptical dimensions, ranging from 1.90 to 2.10. By varying the elliptical dimensions, the frequency of the resonator member with respect to changing temperature may be adjusted to a desired value. Under the above conditions, the frequency change of the resonator member over the temperature range of −20-70 degrees Celsius can be approximately negated at a major/minor axes (Y-over-X) elliptical dimension ratio of approximately 2. That is, in accordance with an embodiment of the present invention, the TCf of a resonator member is effectively zeroed-out by inducing a stress from a stress-inducer member on the resonator member in response to a changing temperature.

Figure 12B:
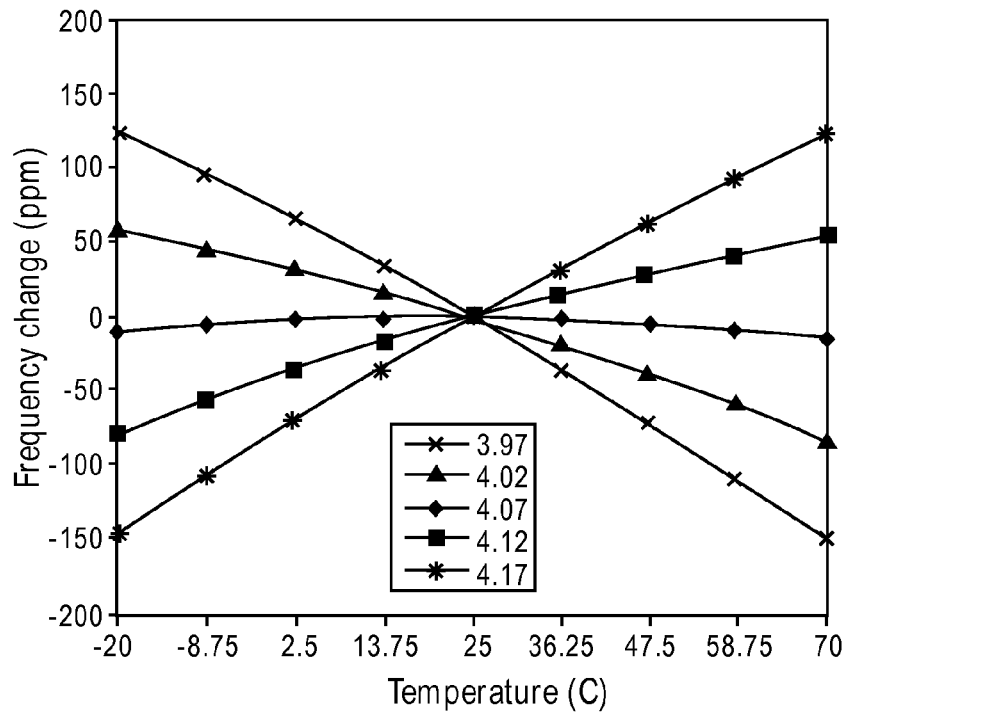

Referring to FIG. 12B, the temperature response is provided for the frequency of a resonator member, housed in an elliptical frame, as a function of the thickness of the elliptical frame parameters (thickness measurement shown in FIG. 11) for a variety of elliptical frames. In this example, the resonator member is a double-ended tuning-fork and the length of each beam of the resonator member is fixed at approximately 65 microns and the width of each beam is fixed at approximately 1.8 microns. For these dimensions, the anti-symmetric mode (the $11^{th}$ mode) of the resonator member has a frequency of approximately 2.4 MHz. Correlation plot 1200B plots several correlations for frame thicknesses, ranging from 3.97 to 4.17 microns. By varying the elliptical frame thickness, the frequency of the resonator member with respect to changing temperature may be adjusted to a desired value. Under the above conditions, the frequency change of the resonator member over the temperature range of −20-70 degrees Celsius can be approximately negated at a frame thickness of approximately 4.07 microns. That is, as above, the TCf of a resonator member is effectively zeroed-out by inducing a stress from a stress-inducer member on the resonator member in response to a changing temperature.

In another aspect of the present invention, an asymmetric frame for a stress inverter member is not limited to a elliptical frame. For example, FIG. 13 illustrates a plan view representing a MEMS structure having a diamond-shaped stress inverter member housing a resonator member, in accordance with an embodiment of the present invention.

Figure 13:
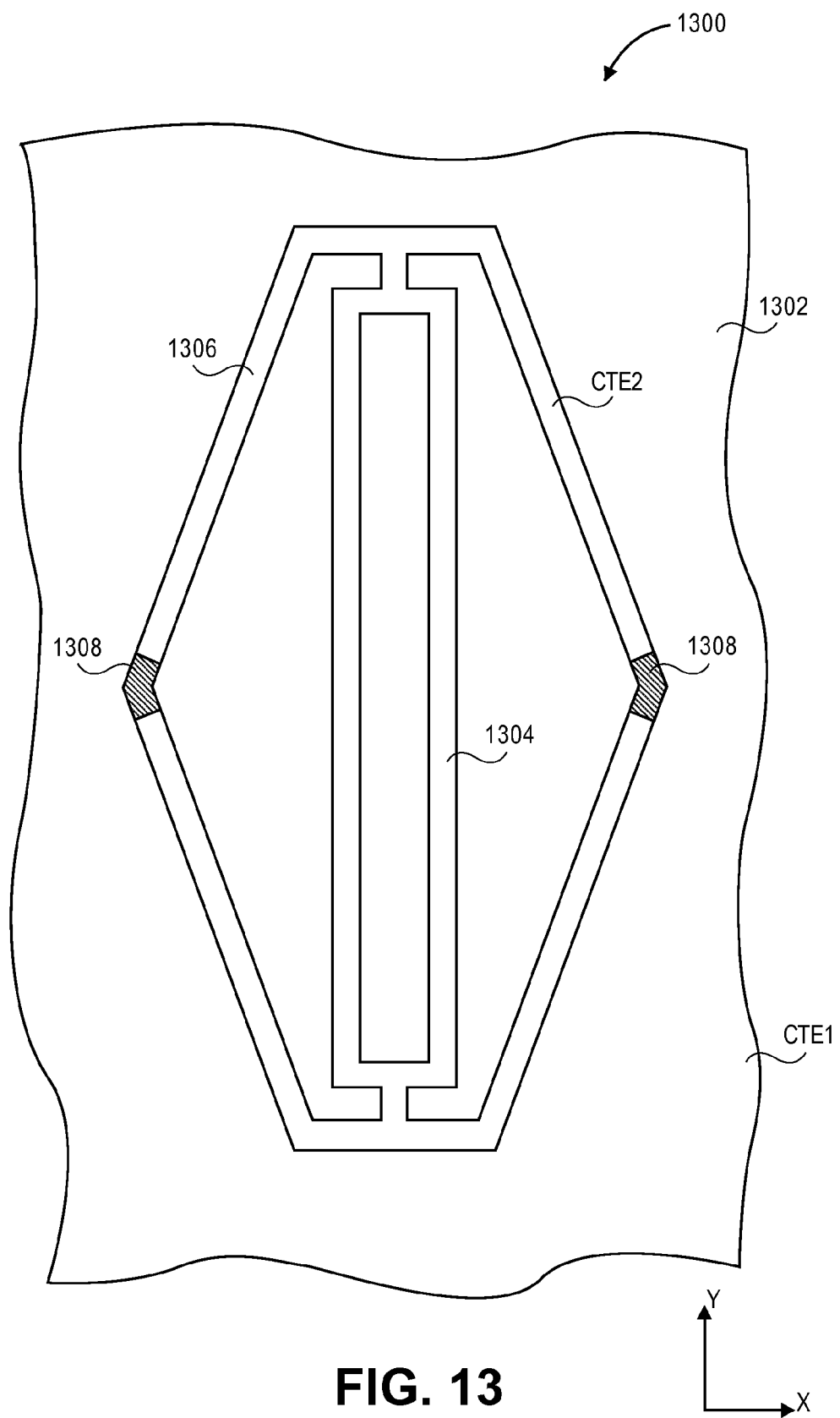
FIG. 13 illustrates a plan view representing a MEMS structure having a diamond-shaped stress inverter member housing a resonator member, in accordance with an embodiment of the present invention.

Referring to FIG. 13, a MEMS structure 1300 is disposed above a substrate 1302. MEMS structure 1300 includes a resonator member 1304 housed in an asymmetric stress inverter member 1306 coupled to substrate 1302. Resonator member 1304 is suspended above substrate 1302. A pair of driver and sensor electrodes, not shown, may be included on either side of resonator member 1304. In accordance with an embodiment of the present invention, asymmetric stress inverter member 1306 is a diamond-shaped frame, as depicted in FIG. 13. In an embodiment, the diamond-shaped frame is directly coupled to substrate 1302 by a pair of anchor points 1308. In one embodiment, the diamond-shaped frame is oriented to have its major axis along the Y-axis and parallel with the longest dimension of resonator member 1304, as is also depicted in FIG. 13. In that embodiment, the pair of anchor points 1308 is arranged orthogonally to the Y-axis and at the mid-point of the major axis, i.e. along the X-axis and parallel with the minor axis of the diamond-shaped frame.

The CTE of asymmetric stress inverter member 1306 (CTE2) may be greater than the CTE of substrate 1302 (CTE1). For example, in an embodiment, asymmetric stress inverter member 1306 is composed of silicon-germanium and substrate 1302 is composed of silicon. In accordance with an embodiment of the present invention, the TCf of resonator member 1304 is negative. In an embodiment, asymmetric stress inverter member 1306 is provided to induce a tensile stress on resonator member 1304 in response to an increase in temperature. For example, in the case where the TCf of resonator member 1304 is negative, in response to a compressive (first) stress applied to stress inverter member 1306 due to CTE mismatch with substrate 1302, stress inverter member 1306 deforms by expanding along the major axis (Y-axis) to provide a tensile (second) stress on resonator member 1304. In an embodiment, the tensile stress reduces the magnitude of the TCf of resonator member 1304. In a specific embodiment, the tensile stress essentially negates the TCf of resonator member 1304. In an embodiment, resonator member 1304 is composed of approximately the same material as asymmetric stress inverter member 1306, e.g. both resonator member 1304 and asymmetric stress inverter member 1306 may be composed of silicon-germanium while substrate 1302 may be composed of silicon. In another embodiment, resonator member 1304 is completely surrounded by stress inverter member 1306, e.g., resonator member 1304 is completely surrounded by the diamond-shaped frame, as depicted in FIG. 13.

In accordance with an embodiment of the present invention, a diamond-shaped frame is utilized to partially decouple the effect of the substrate and stress inverter CTE mismatch. However, the specific dimensions of the diamond-shaped frame may be selected to fine-tune such partial decoupling. For example, FIG. 14 is a correlation plot representing frequency variation as a function of temperature for a MEMS structure having a diamond-shaped stress inverter member housing a resonator member, in accordance with an embodiment of the present invention.

Figure 14:
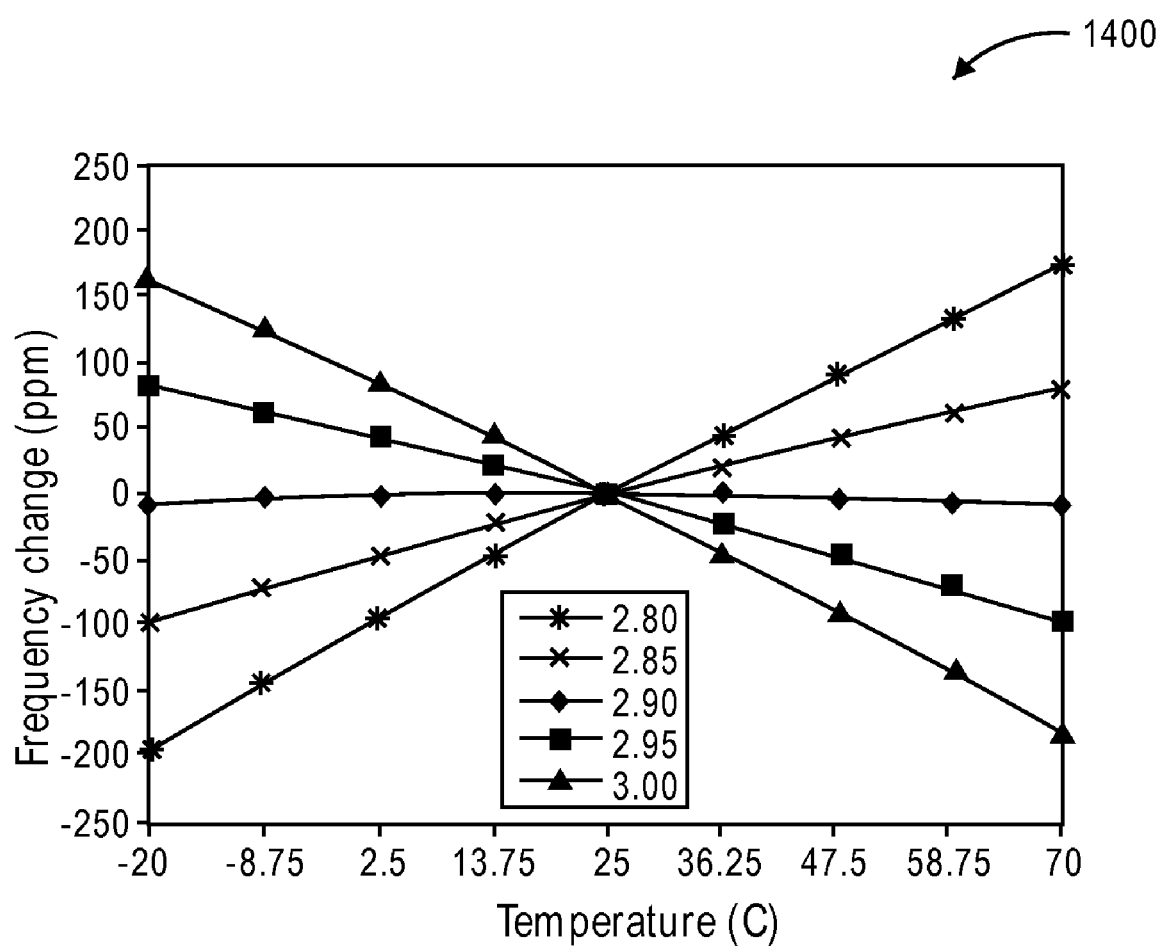
FIG. 14 is a correlation plot representing frequency variation as a function of temperature for a MEMS structure having a diamond-shaped stress inverter member housing a resonator member, in accordance with an embodiment of the present invention.

Referring to FIG. 14, the temperature response is provided for the frequency of a resonator member, housed in a diamond-shaped frame, as a function of the ratio of the major/minor axis (Y-over-X) parameters (axes shown in FIG. 13) for a variety of diamond-shaped geometries. In this example, the resonator member is a double-ended tuning-fork and the length of each beam of the resonator member is fixed at approximately 70 microns and the width of each beam is fixed at approximately 1.8 microns. For these dimensions, the anti-symmetric mode (the $11^{th}$ mode) of the resonator member has a frequency of approximately 2.05 MHz. Correlation plot 1400 plots several correlations for major/minor (Y-over-X) diamond-shaped axes ratios, ranging from 2.80 to 3.00. By varying the diamond-shaped dimensions, the frequency of the resonator member with respect to changing temperature may be adjusted to a desired value. Under the above conditions, the frequency change of the resonator member over the temperature range of −20-70 degrees Celsius can be approximately negated at a major/minor axes ratio (Y-over-X) of approximately 2.90. That is, in accordance with an embodiment of the present invention, the TCf of a resonator member is effectively zeroed-out by inducing a stress from a stress-inducer member on the resonator member in response to a changing temperature.

It is to be understood that other MEMS configurations may be made to effect a desired characteristic of the TCf of a resonator member. For example, in addition to the above embodiment, where an asymmetric frame applies a tensile stress to a resonator member in response to an increase in temperature, in one embodiment, an asymmetric frame is used to apply a compressive stress to a resonator member in response to a decrease in temperature. In another embodiment, an asymmetric frame is used to apply a compressive stress to a resonator member in response to a increase in temperature. In yet another embodiment, an asymmetric frame is used to apply a tensile stress to a resonator member in response to a decrease in temperature. The ordering and magnitude of the CTE mismatch between a stress inverter member of a MEMS structure and an underlying substrate may be selected depending on the desired application. Furthermore, an asymmetric frame is not limited to only an elliptical frame or a diamond-shaped frame. Rather, any frame having a major axis/minor axis pairing may be considered. Also, the longest dimension of a resonator housed in the asymmetric frame can be aligned with the major axis, the minor axis, or skewed between the major and the minor axis. Additionally, an asymmetric frame may be anchored off-set from a mid-point of the frame or in a skewed fashion relative to the longest dimension of a resonator member housed therein or may further include decoupling members, such as decoupling rings or beams.

Thus, a MEMS structure having a temperature-compensated resonator member has been disclosed. In an embodiment, the MEMS structure comprises a stress inverter member coupled with a substrate. A resonator member is housed in the stress inverter member and is suspended above the substrate. In one embodiment, the MEMS stress inverter member is used to alter the TCf of the resonator member by inducing a stress on the resonator member in response to a change in temperature. In another embodiment, the stress inverter member is coupled with the substrate via a pair of decoupling members. In one embodiment, the pair of decoupling members is provided to reduce the magnitude of the stress induced on the resonator member. In a specific embodiment, an array of n rows and m columns of stress inverter members is provided. Each stress inverter member houses a resonator member suspended above a substrate and is connected to a pair of decoupling members coupled with the substrate.

What is claimed is:

1. A MEMS structure, comprising:
 a stress inverter member coupled to a substrate, the stress inverter member having a major axis and a minor axis; and
 a resonator member housed in said stress inverter member and suspended above said substrate.

2. The MEMS structure of claim 1, wherein the shape of said stress inverter member is selected from the group consisting of elliptical and diamond-shaped.

3. The MEMS structure of claim 1, wherein the coefficient of thermal expansion (CTE) of said stress inverter member is greater than the CTE of said substrate.

4. The MEMS structure of claim 3, wherein said stress inverter member consists essentially of silicon-germanium, and wherein said substrate consists essentially of silicon.

5. The MEMS structure of claim 1, wherein the thermal coefficient of frequency of said resonator member is negative, and wherein said stress inverter member is for inducing a tensile stress on said resonator member in response to an increase in temperature.

6. The MEMS structure of claim 5, wherein said stress inverter member and said resonator member consist essentially of silicon-germanium, and wherein said substrate consists essentially of silicon.

7. The MEMS structure of claim 1, wherein said stress inverter member is coupled directly to said substrate by a pair of anchor points arranged orthogonally to the longest dimension of said resonator member.

8. A MEMS structure, comprising:
 a frame coupled to a substrate by a pair of anchor points, the frame having a major axis and a minor axis and wherein the coefficient of thermal expansion (CTE) of said frame is different from the CTE of said substrate;
 a resonator member housed in said frame and suspended above said substrate, wherein said resonator member is, in one plane, completely surrounded by said frame; and
 a pair of electrodes coupled with said substrate on either side of said resonator member;
 where in response to a first applied stress, the frame is configured to apply a second, opposite, stress to said resonator member.

9. The MEMS structure of claim 8, wherein the shape of said frame is selected from the group consisting of elliptical and diamond-shaped.

10. The MEMS structure of claim 8, wherein the CTE of said stress inverter member is greater than the CTE of said substrate.

11. The MEMS structure of claim 10, wherein said frame consists essentially of silicon-germanium, and wherein said substrate consists essentially of silicon.

12. The MEMS structure of claim 8, wherein said pair of anchor points couples said frame directly to said substrate and is arranged orthogonally to the longest dimension of said resonator member.

13. The MEMS structure of claim 8, wherein the thermal coefficient of frequency of said resonator member is negative, and wherein said stress inverter member is for inducing a tensile stress on said resonator member in response to an increase in temperature.

14. A method for altering the thermal coefficient of frequency of a MEMS structure, comprising:
 providing a resonator member housed in a frame coupled to a substrate, the frame having a major axis and a minor axis, wherein said resonator member is suspended above said substrate, and wherein the coefficient of thermal expansion (CTE) of said frame is different from the CTE of said substrate; and
 applying a first stress to said frame, wherein, in response to applying said first stress, said frame applies a second, opposite, stress to said resonator member.

15. The method of claim 14, wherein providing said frame comprises providing a frame having a shape selected from the group consisting of elliptical and diamond-shaped, and coupled directly to said substrate by a pair of anchor points.

16. The method of claim 14, wherein applying said second stress reduces the magnitude of the thermal coefficient of frequency of said resonator member.

17. The method of claim 16, wherein said frame applies a tensile stress to said resonator member in response to an increase in temperature.

18. The method of claim 16, wherein said frame applies a compressive stress to said resonator member in response to a decrease in temperature.

19. The method of claim 16, wherein said frame applies a compressive stress to said resonator member in response to an increase in temperature.

20. The method of claim 16, wherein said frame applies a tensile stress to said resonator member in response to a decrease in temperature.

21. The method of claim 14, wherein said resonator member is, in one plane, completely surrounded by said frame.

22. A MEMS structure, comprising:
   a stress inverter member coupled to a substrate, the stress inverter member having a first longer axis and a second shorter axis; and
   a resonator member housed in said stress inverter member and suspended above said substrate, the resonator member being attached to the stress inverter member between two opposing points on the first longer axis of the stress inverter member, and the stress inverter member being coupled to the substrate by a pair of anchor points that are aligned parallel with the second shorter minor axis.

23. A MEMS structure, comprising:
   a frame coupled to a substrate by a pair of anchor points, the frame having a first longer axis and a second shorter axis and wherein the coefficient of thermal expansion (CTE) of said frame is different from the CTE of said substrate;
   a resonator member housed in said frame and suspended above said substrate, wherein said resonator member is, in one plane, completely surrounded by said frame, the resonator member being attached to the frame between two opposing points on the first longer axis of the frame, and the frame being coupled to the substrate by a pair of anchor points that are aligned parallel with the second shorter minor axis; and
   a pair of electrodes coupled with said substrate on either side of said resonator member.

24. A method for altering the thermal coefficient of frequency of a MEMS structure, comprising:
   providing a resonator member housed in a frame coupled to a substrate, the frame having a first longer axis and a second shorter axis, wherein said resonator member is suspended above said substrate, wherein the coefficient of thermal expansion (CTE) of said frame is different from the CTE of said substrate, the resonator member being attached to the frame between two opposing points on the first longer axis of the frame, and the frame being coupled to the substrate by a pair of anchor points that are aligned parallel with the second shorter minor axis; and
   applying a first stress to said frame, wherein, in response to applying said first stress, said frame applies a second, opposite, stress to said resonator member.

* * * * *